(12) United States Patent
Asano

(10) Patent No.: US 7,298,800 B2
(45) Date of Patent: Nov. 20, 2007

(54) ANALOG SIGNAL CONTROL METHOD, ANALOG SIGNAL CONTROLLER, AND AUTOMATIC GAIN CONTROLLER

(75) Inventor: Shigetaka Asano, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 670 days.

(21) Appl. No.: 10/091,432

(22) Filed: Mar. 7, 2002

(65) Prior Publication Data

US 2003/0032402 A1 Feb. 13, 2003

(30) Foreign Application Priority Data

Aug. 10, 2001 (JP) ............................. 2001-244524

(51) Int. Cl.
*H04L 27/06* (2006.01)
(52) U.S. Cl. .................... 375/344; 375/345; 375/346; 375/359; 455/234.1
(58) Field of Classification Search ................ 375/344, 375/345, 346, 316, 341, 342, 343, 362, 373, 375/226, 327, 376; 455/344, 345, 234.1; 341/116, 151, 155, 160, 161
See application file for complete search history.

(56) References Cited

U.S. PATENT DOCUMENTS

| | | | | | |
|---|---|---|---|---|---|
| 4,272,648 | A | * | 6/1981 | Agrawal et al. ............. | 381/108 |
| 4,439,864 | A | * | 3/1984 | Qureshi ....................... | 375/345 |
| 4,785,352 | A | * | 11/1988 | Burrowes et al. .......... | 348/678 |
| 4,884,192 | A | * | 11/1989 | Terada et al. ............... | 709/251 |
| 5,243,412 | A | * | 9/1993 | Goukura et al. ............ | 348/505 |
| 5,305,351 | A | * | 4/1994 | Mizoguchi ................... | 375/232 |
| 5,400,148 | A | * | 3/1995 | Kashida et al. .............. | 386/46 |
| 5,566,211 | A | * | 10/1996 | Choi ........................... | 375/332 |
| 5,721,546 | A | * | 2/1998 | Tsutsumishita ............ | 341/116 |
| 6,005,889 | A | * | 12/1999 | Chung et al. ............... | 375/140 |
| 6,122,331 | A | * | 9/2000 | Dumas ....................... | 375/345 |
| 6,148,045 | A | * | 11/2000 | Taura et al. ................ | 375/344 |
| 6,192,089 | B1 | * | 2/2001 | Corleto et al. ............. | 375/344 |
| 6,222,478 | B1 | * | 4/2001 | Bright ....................... | 341/162 |
| 6,252,464 | B1 | * | 6/2001 | Richards et al. ............ | 331/4 |
| 6,563,859 | B1 | * | 5/2003 | Oishi et al. ................. | 375/148 |
| 6,897,724 | B2 | * | 5/2005 | Gurvich et al. ............ | 330/151 |
| 6,937,176 | B2 | * | 8/2005 | Freeman et al. ........... | 341/143 |

FOREIGN PATENT DOCUMENTS

CN 441168 6/2001

OTHER PUBLICATIONS

Turner P. G. et al "Chip Rate Processing For Software Defined Radios", 3G Mobile Communication Technologies, 2001. Second International Conference, Mar. 2001, pp. 292-296.*
Lovrich, A. Troullinos, G. Chirayil, R.: "An all digital automatic gain control", Texas Instrum. Inc., Houston, TX, USA, Acoustics, Speech, and Signal Processing, 1988, ICASSP-88, 1988 International Conference on Publication, Apr. 11-14, 1988, pp. 3-12.*
Camilleri, P.F. Sobelman, G.E., "Digital automatic gain control for hearing aids", Dept. Of Electrical Eng., Minnesota Univ., Minneapolis, MN, VLSI Signal Processing, VII, Oct. 1994, pp. 3-12.*

* cited by examiner

*Primary Examiner*—Mohammed Ghayour
*Assistant Examiner*—Qutub Ghulamali
(74) *Attorney, Agent, or Firm*—Staas & Halsey LLP

(57) ABSTRACT

An analog signal control method for accurately controlling an analog signal irrespective of a latency. The analog signal control method includes the steps of converting the analog signal to a digital signal, performing an arithmetic processing of the digital signal to generate a control signal for controlling the analog signal, delaying the analog signal corresponding to a latency caused by the generation of the control signal to generate a delayed analog signal, and controlling the delayed analog signal in accordance with the control signal.

23 Claims, 25 Drawing Sheets

US 7,298,800 B2

ANALOG SIGNAL CONTROL METHOD, ANALOG SIGNAL CONTROLLER, AND AUTOMATIC GAIN CONTROLLER

BACKGROUND OF THE INVENTION

The present invention relates to an analog signal control method, an analog signal controller, and an AGC.

In recent years, analog signals are controlled by digital signals. Data read from a recording medium, for example, a magnetic disk is an analog signal which is converted to a digital signal. An amplification ratio of GCA (gain control amplifier) is calculated from the digital signal. The calculated amplification ratio is fed back to control the amplitude of the analog signal. The feedback loop is repeated to control the amplitude of the analog signal to be constant. In this event, since processing time (control delay: latency) on a calculating path for the digital processing affects the controllability of the analog signal, improved digital processing is required.

FIG. 1 is a schematic block diagram illustrating the configuration of a conventional analog signal controller 111. The analog signal controller 111 includes an analog control circuit 112, an A/D converter circuit (hereinafter referred to as ADC) 113, and a digital arithmetic circuit 114.

The analog signal controller 111 receives an analog input signal IN which is data read, for example, from a recording medium. After performing predetermined processing on the analog input signal IN, the analog signal controller 111 supplies the processed signal to a next circuit 115. The ADC 113 and the digital arithmetic circuit 114 operate in accordance with a clock signal CLK supplied from a PLL circuit, not shown.

The analog control circuit 112 processes the analog input signal IN in accordance with a control signal S31 to generate an analog processed signal S32. The analog control circuit 112 receives the control signal S31 from the digital arithmetic circuit 114. The analog processed signal S32 is supplied to the ADC 113 and the next circuit 115.

The ADC 113 converts the analog processed signal S32 to a digital signal S33 which is supplied to the digital arithmetic circuit 114.

The digital arithmetic circuit 114 executes various forms of calculation processing in accordance with the digital signal S33 to generate the control signal S31. The digital arithmetic circuit 114 feeds back the control signal S31 to the analog control circuit 112.

The analog signal controller 111 generates the control signal S31 in accordance with the analog processed signal S32, and controls the analog input signal IN in accordance with the control signal S31 in a feedback manner.

However, the analog signal controller 111 experiences a control delay (latency) caused by a control loop (comprised of the ADC 113 and digital arithmetic circuit 114) for controlling the analog input signal IN.

FIG. 2 is a block diagram of an automatic gain controller (hereinafter referred to as AGC), for example, in which the conventional analog signal controller 111 is embodied. The AGC 121 includes a gain control amplifier (hereinafter referred to as GCA) 112, a low pass filter (hereinafter referred to as LPF) 123, an ADC 124, an error calculating circuit 125, and a D/A converter circuit (hereinafter referred to as DAC) 126. The ADC 124 and the error calculating circuit 125 operate in accordance with a clock signal CLK supplied from a PLL circuit.

The GCA 122 receives an analog input signal IN. The GCA 122 amplifies the analog input signal IN with a predetermined gain in accordance with a control signal S41 to generate an analog amplified signal S42. The analog amplified signal S42 is supplied to the LPF 123.

The LPF 123 removes high frequency components from the analog amplified signal S42 amplified by the GCA 122 to generate an analog signal S43. The analog signal S43 is supplied to the ADC 124. The ADC 124 converts the analog signal S43 to a digital signal S44 which is supplied to the error calculating circuit 125.

The error calculating circuit 125 compares the digital signal S44 with a predetermined target value, and integrates its error components to generate an error digital signal S45 which is supplied to the DAC 126. The GCA 122 amplifies the analog input signal IN such that the target value causes the amplitude of the analog signal S43 to substantially cover a full input range of the ADC 124.

The DAC 126 converts the error digital signal S45 to an analog signal to generate the control signal S41 which is fed back to the GCA 122.

FIG. 3 is a block diagram illustrating the specific configuration of the error calculating circuit 125. The error calculating circuit 125 includes first to third calculating circuits 131 to 133, and first to third flip-flops (hereinafter referred to as FFs) 134 to 136.

The first calculating circuit 131 is an arithmetic circuit which takes an absolute value of the digital signal S44 and outputs the absolute digital signal. The first FF 134 latches the output signal of the first calculating circuit 131 in response to a clock signal CLK to generate a first latch signal D1. The first latch signal D1 is supplied to the second calculating circuit 132.

The second calculating circuit 132 calculates an error component between a target value previously stored in a register (not shown) and the first latch signal D1 to generate an error signal D2 in accordance with the result of the calculation. The error signal D2 is supplied to the second FF 135. The second FF 135 latches the error signal D2 in response to the clock signal CLK to generate a second latch signal A. The second latch signal A is supplied to the third calculating circuit 133.

The third calculating circuit 133 integrates the second latch signal A to generate an integration signal S. The integration signal S is fed back to the input side of the third calculating circuit 133. The third FF 136 latches the integration signal S in response to the clock signal CLK to generate an error digital signal S45. The error digital signal S45 is supplied to the DAC 126.

The AGC 121 optimizes the gain of the GCA 122 by a control loop which feeds back the control signal S41 in accordance with the analog amplified signal S42. The AGC 121 supplies the digital signal S44 to a next digital circuit.

However, in the AGC 121, a processing time taken by the ADC 124 and the error calculating circuit 125 in the control loop causes a latency for the analog input signal IN.

The error calculating circuit 125 is provided with the first to third FFs 134 to 136 at the input and output stages of the second and third calculating circuits 132, 133 (see FIG. 3) for increasing the calculating speed of these circuits. A latency occurring in the error calculating circuit due to the first to third FFs 134 to 136 at three stages corresponds to three clock pulses of the clock signal CLK, and particularly, the error calculating circuit 125 is significantly affected by the latency.

For example, as illustrated in FIG. 4, the analog input signal IN is sampled at time T1, and the GCA 122 is supplied at time T2 with the control signal S41 which is generated from a digital signal having a sampling value through the ADC 124 and the error calculating circuit 125. The control signal S41 generated from the analog input signal IN at time T1 acts on the analog input signal IN at time T2.

A difference between the times T1, T2 (=T2−T1) indicates the processing time taken by the ADC 124 and error calculating circuit 125, i.e., the control delay (latency). The control signal S41 supplied at time T2 is not suitable for the analog input signal IN at that time. Although the control signal S41 includes a calculated value based on a difference between the value of the analog input signal IN at time T1 and a target value, it does not include any calculated value based on a difference between the value of the analog input signal IN at time T2 and the target value. Therefore, the error calculating circuit suffers from low accuracy for analog signal control, and a long time for convergence of the amplitude of the analog input signal IN to a fixed value.

SUMMARY OF THE INVENTION

It is an object of the present invention to provide an analog signal control method, an analog signal controller, and an AGC which are capable of accurately controlling an analog signal irrespective of a latency.

To achieve the above object, the present invention provides an analog signal control method. The method includes the steps of converting the analog signal to a digital signal, performing an arithmetic processing of the digital signal to generate a control signal for controlling the analog signal, delaying the analog signal corresponding to a latency caused by the generation of the control signal to generate a delayed analog signal, and controlling the delayed analog signal in accordance with the control signal.

A further perspective of the present invention is an analog signal control method. The method includes the steps of converting the analog signal to a digital signal, performing an arithmetic processing of the digital signal to generate a control signal for controlling the analog signal, delaying the analog signal corresponding to a latency caused by the generation of the control signal in synchronism with a clock signal to generate a delayed analog signal, and controlling the delayed analog signal in accordance with the control signal.

A further perspective of the present invention is an analog signal controller. The controller includes an ADC for analog-to-digital converting an analog signal to generate a digital signal. A digital arithmetic circuit is connected to the ADC for performing an arithmetic processing of the digital signal to generate a control signal for controlling the analog signal. A delay circuit receives the analog signal, and delays the analog signal corresponding to a latency caused by the ADC and the digital arithmetic circuit to generate a delayed analog signal. An analog control circuit is connected to the digital arithmetic circuit and the delay circuit for controlling the delayed analog input signal in accordance with the control signal.

A further perspective of the present invention is an automatic gain controller. The controller includes a first control loop for receiving an analog signal to generate a control signal for setting a predetermined gain for use in amplifying the analog signal. A delay circuit receives the analog signal, and delays the analog signal corresponding to a latency caused by the first control loop to generate a delayed analog signal. A GCA is connected to the delay circuit and the first control loop for amplifying the delayed analog signal in accordance with a predetermined gain set by the control signal to generate an amplified analog signal.

A further perspective of the present invention is an automatic gain controller. The controller includes a first control loop, a delay circuit, and a second GCA. The first control loop includes a first GCA, an ADC, an error calculating circuit, and a DAC. The first GCA amplifies the analog signal in accordance with a first predetermined gain to generate a first amplified analog signal. The ADC is connected to the first GCA for analog-to-digital converting the first amplified analog signal to generate a digital signal. The error calculating circuit is connected to the ADC for calculating an error between a target value which is set such that the first amplified analog signal substantially covers a full range for an input level of the ADC, and the digital signal to generate an error digital signal in accordance with the error. The DAC is connected to the error calculating circuit for digital-to-analog converting the error digital signal to generate a control signal for setting a second predetermined gain. The delay circuit delays the analog signal corresponding to a latency occurring in the first control loop to generate a delayed analog signal. The second GCA is connected to the delay circuit and the first control loop for amplifying the delayed analog signal in accordance with the second predetermined gain set by the control signal to generate a second amplified analog signal.

A further perspective of the present invention is an automatic gain controller. The controller includes a first ADC for sampling an analog signal to generate a first plurality of sampling values the first ADC generates a first digital signal in accordance with the first plurality of sampling values. A first average processing circuit is connected to the first ADC for calculating an average value of the first plurality of sampling values in accordance with the first digital signal to generate a first average value signal indicative of the calculated average value. A first gain selector circuit is connected to the first average processing circuit for selecting a first gain for controlling the analog signal in accordance with the average value of the first average value signal, and generating a first control signal in accordance with the selected first gain. A first delay circuit receives the analog signal, and delays the analog signal corresponding to a first latency occurring in the first ADC, the first average processing circuit, and the first gain selector circuit to generate a first delayed analog signal. A gain switching amplifier is connected to the first delay circuit and the first gain selector circuit for amplifying the first delayed analog signal in accordance with the first gain selected by the first control signal to generate a first amplified analog signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
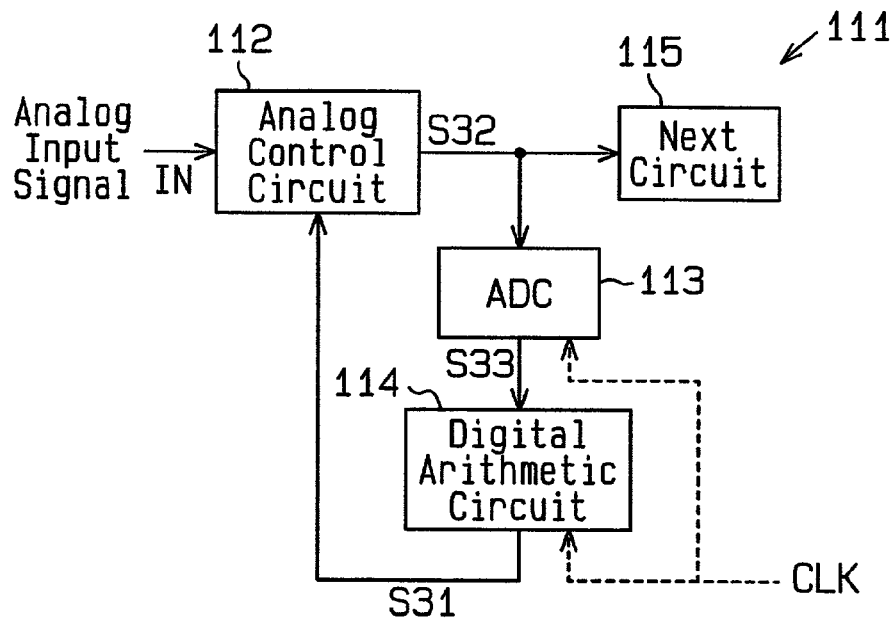
FIG. 1 is a schematic block diagram of a conventional analog signal controller.

In the drawings, like numerals are used for like elements throughout.

First Embodiment

Figure 5:
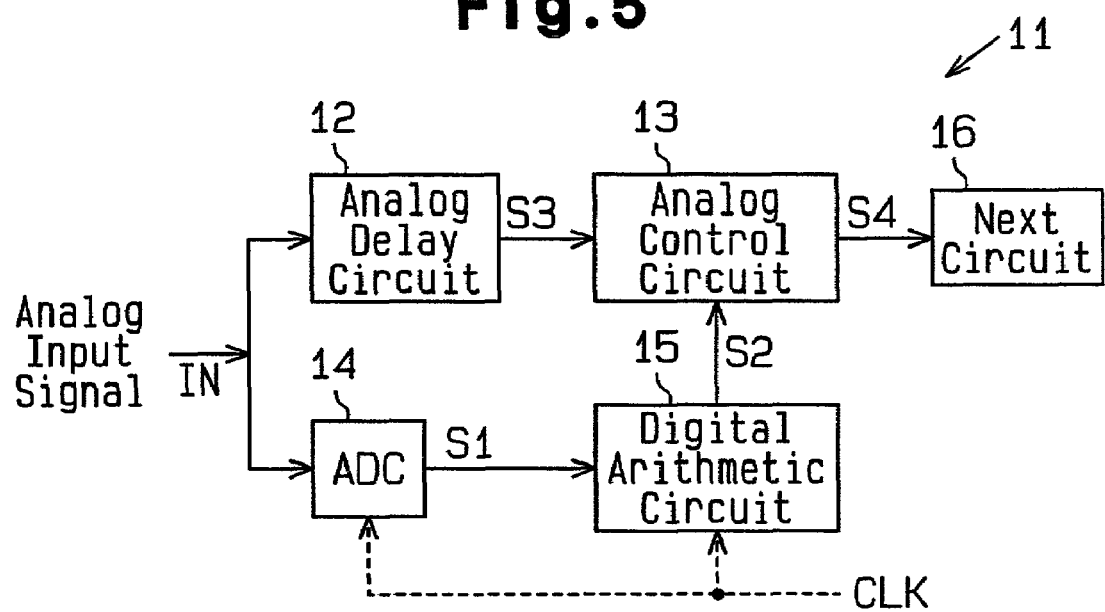
FIG. 5 is a schematic block diagram of an analog signal controller according to a first embodiment of the present invention.

FIG. 5 is a schematic circuit block diagram of an analog signal controller 11 according to a first embodiment of the present invention. The analog signal controller 11 includes an analog delay circuit (hereinafter referred to as delay circuit) 12, an analog control circuit 13, an A/D converter circuit (hereinafter referred to as ADC) 14, and a digital arithmetic circuit 15.

The analog signal controller 11 receives an analog input signal (for example, data read from a recording medium) IN, and performs predetermined processing on the analog input signal (analog signal) IN. The processed analog input signal IN is supplied to a next circuit 16.

The analog input signal IN is supplied to the delay circuit 12 and ADC 14. The ADC 14 converts the analog input signal IN to generate a digital signal S1. The digital signal S1 is supplied to the digital arithmetic circuit 15.

The arithmetic circuit 15 executes predetermined arithmetic processing in accordance with the digital signal S1 to generate a control signal S2 in accordance with the processing result. The control signal S2 is supplied to the control circuit 13. The ADC 14 and the digital arithmetic circuit 15 receive a clock signal CLK generated, for example, by a PLL circuit, not shown, and operate in accordance with the clock signal CLK.

The delay circuit 12 delays the analog input signal IN in accordance with a predetermined delay value to generate an analog delay signal S3. The analog delay signal S3 is supplied to the control circuit 13. More specifically, the predetermined delay value is set to be equal to a control delay value (latency) in the ADC 14 and the digital arithmetic circuit 15 (i.e., a path for generating the control signal S2). The predetermined delay value is set by the capacitance of one or more capacitors provided in the delay circuit 12. Therefore, the delay of the analog delay signal S3 is equal to the sum of latencies of the ADC 14 and the arithmetic circuit 15.

Figure 7:
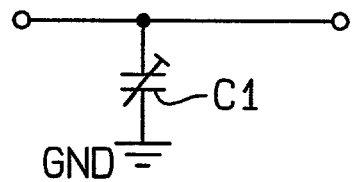
FIG. 7 is a schematic diagram showing a capacitor of the analog signal controller of FIG. 5.

The delay circuit 12 includes a capacitor (not shown) with a predetermined capacitance value. Alternatively, a variable capacitor C1 capable of varying the capacitance may be connected to the delay circuit 12 to adjust the variable capacitor C1 as appropriate, as illustrated in FIG. 7.

The analog control circuit 13 controls the analog delay signal S3 in accordance with the digital control signal S2 supplied from the digital arithmetic circuit 15 to generate a control signal S4. The control signal S4 is supplied to the next circuit 16. The analog control circuit 13 generates the analog or digital control signal S4 depending on the circuit configuration (an analog circuit or a digital circuit) of the next circuit 16.

The analog input signal IN is converted to the digital signal S1 through the ADC 14, and the digital arithmetic circuit 15 processes the digital signal S1 to generate the digital control signal S2. The digital control signal S2 is supplied to the analog control circuit 13. The analog input signal IN is also supplied to the delay circuit 12. The delay circuit 12 delays the analog input signal IN such that the delay is substantially equal to the latency in the ADC 14 and the arithmetic circuit 15 to generate the analog delay signal S3. The analog delay signal S3 is supplied to the analog control circuit 13 which controls the analog delay signal S3, having substantially the same value as the signal value of the analog input signal IN sampled in the ADC 14, in accordance with the digital control signal S2.

Figure 6:
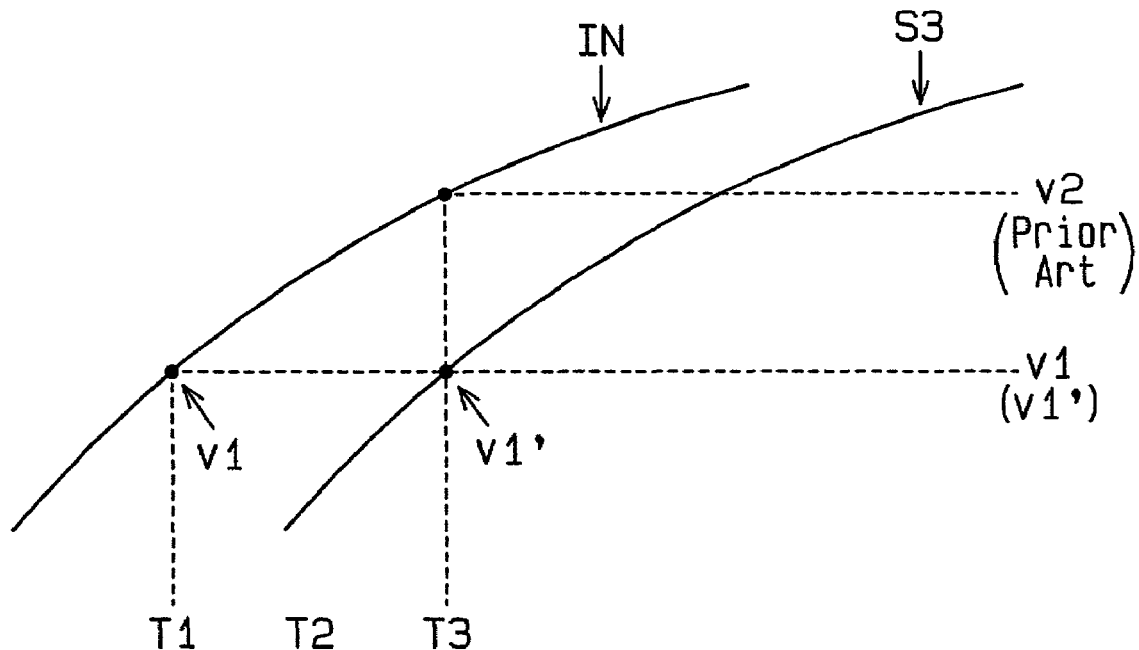
FIG. 6 is a waveform chart of analog signals in the analog signal controller of FIG. 5.

Next, the action of the analog signal controller 11 will be described. FIG. 6 is a waveform chart showing the action of the analog signal controller 11.

At time T1 in FIG. 6, the ADC 14 receives an analog input signal IN, and samples the analog input signal IN. The ADC 14 converts the analog input signal IN, which is sampled and held thereby, to a digital signal S1 (time T2). Next, the digital arithmetic circuit 15 processes the digital signal S1 to generate a digital control signal S2, and supplies the digital control signal S2 to the analog control circuit 13 at time T3.

In this event, a delay value corresponding to a latency (T3−T1) is set in the delay circuit 12, so that the delay circuit 12 delays the analog input signal IN by the delay value (T3−T1) to generate an analog delay signal S3. The analog delay signal S3 is supplied to the control circuit 13. As a result, the signal value (V1) of the analog input signal IN sampled by the ADC 14 at time T1 is substantially identical to the signal value (V1') of the analog delay signal S4 controlled by the control circuit 13 at time T3.

At time T3 in FIG. 6, the signal value (V2) of the analog input signal IN is shown when the delay circuit 12 is not provided as is common in the prior art. Conventionally, due to the influence of the latency of the delay value (T3−T1), the digital control signal S2 generated in accordance with the analog input signal sampled at time T1 controls the analog input signal IN having the signal value (V2) at time T3.

The analog signal controller 11 according to the first embodiment has the following advantages.

(1) The delay circuit 12 of the analog signal controller 11 delays the analog input signal IN by a time substantially corresponding to the latency in the path (ADC 14 and digital arithmetic circuit 15) for generating the digital control signal S2. The analog control circuit 13 controls the analog delay signal S3 having substantially the same value as the signal of the analog input signal IN sampled and held by the ADC 14 in accordance with the digital control signal S2. This prevents a delay in the control timing for the analog input signal IN resulting from the latency in the path for generating the digital control signal S2.

(2) By setting a delay corresponding to a possibly occurring latency in the delay circuit 12, a delay in the control timing can be prevented irrespective of the latency, thereby achieving an appropriate control for an analog signal. A highly accurate analog signal control is provided to realize an analog signal control which is capable of rapidly converging an analog input signal IN.

Second Embodiment

Figure 8:
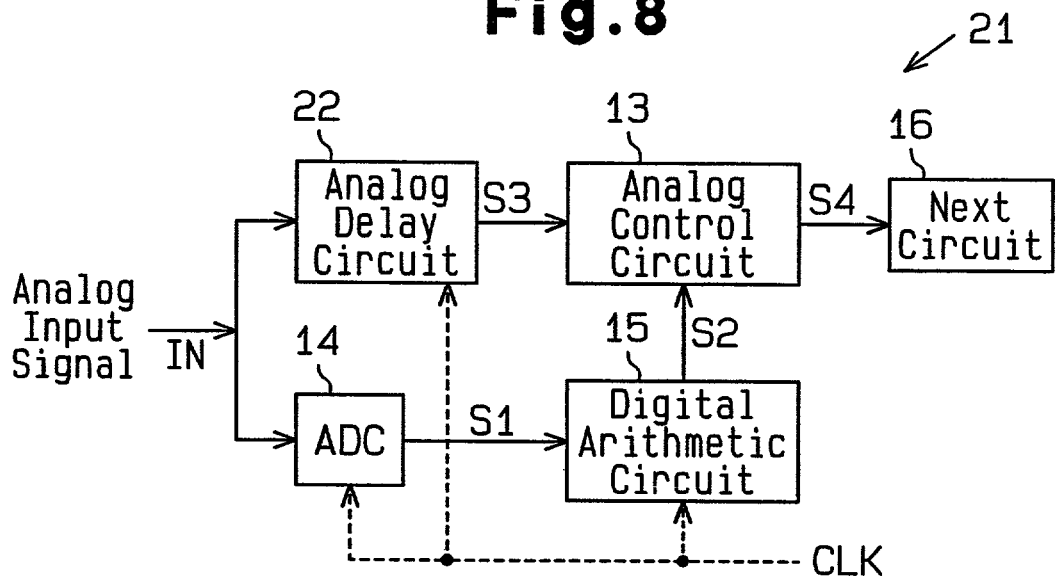
FIG. 8 is a schematic block diagram of an analog signal controller according to a second embodiment of the present invention.

FIG. 8 is a schematic block diagram of an analog signal controller 21 according to a second embodiment of the present invention. The analog signal controller 21 of the second embodiment differs from the analog signal controller 11 of the first embodiment only in the analog delay circuit.

An analog delay circuit (hereinafter referred to as delay circuit) 22 in the analog signal controller 21 of the second embodiment receives a clock signal CLK, and delays an analog input signal IN in synchronism with the clock signal CLK. The delay circuit 22 includes a plurality of delay stages for generating a predetermined delay time.

In the analog signal controller 21, an analog control circuit 13 controls a signal value (V1') of an analog delay signal S3, which is substantially identical to a signal value (V1) of the analog input signal IN sampled by an ADC 14, with a digital control signal S2 (see FIG. 6).

Figure 9:
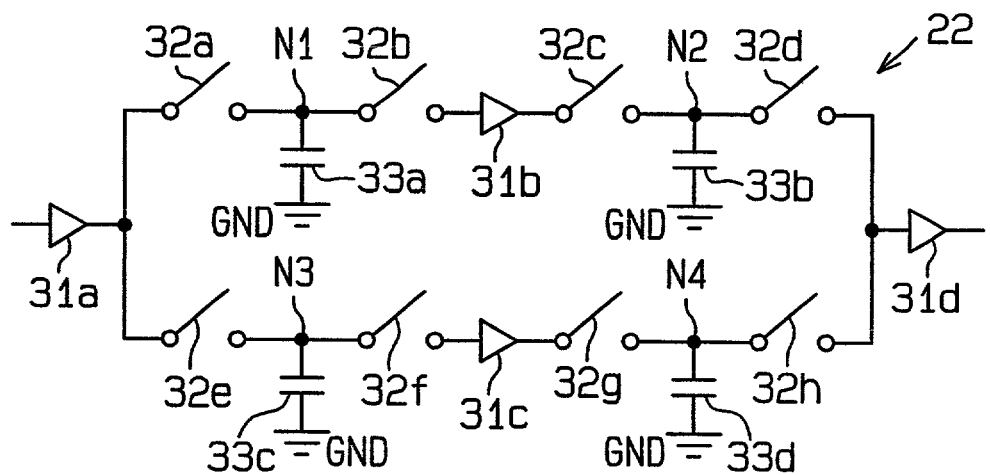
FIG. 9 is a schematic circuit diagram of a delay circuit in the analog signal controller of FIG. 8.

FIG. 9 is a schematic circuit diagram of the delay circuit 22. The delay circuit 22 has two stages of delays to delay the analog input signal, for example, by a time corresponding to two clock pulses of the clock signal CLK.

The delay circuit 22 includes first to fourth buffers 31a to 31d, first to eighth switching elements (hereinafter referred to as switches) 32a to 32h, and first to fourth capacitors 33a to 33d.

The first buffer 31a is connected to the second buffer 31b through the first and second switches 32a, 32b, while the second buffer 31b is connected to the fourth buffer 31d through the third and fourth switches 32c, 32d. The first buffer 31a is also connected to the third buffer 31c through the fifth and sixth switches 32e, 32f, while the buffer 31c is connected to the fourth buffer 31d through the seventh and eighth switches 32g, 32h.

The first capacitor 33a has a first end connected to a node N1 between the first and second switches 32a, 32b, and a second end connected to a ground GND. The second capacitor 33b has a first end connected to a node N2 between the third and fourth switches 32c, 32d, and a second end connected to the ground GND.

The third capacitor 33c has a first end connected to a node N3 between the fifth and sixth switches 32e, 32f, and a second end connected to the ground GND. The fourth capacitor 33d has a first end connected to a node N4 between the seventh and eighth switches 32g, 32h, and a second end connected to the ground GND.

Figure 10:
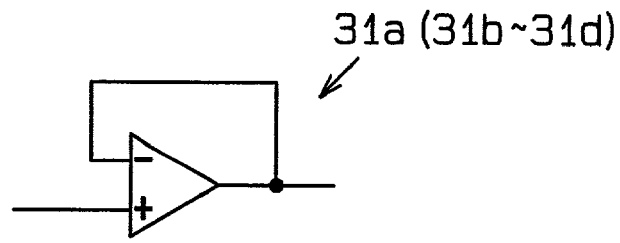
FIG. 10 is a schematic circuit diagram of a buffer in the analog signal controller of FIG. 8.

The first to fourth buffers 31a to 31d of the second embodiment include an operational amplifier which has a voltage follower function with an amplification ratio equal to "1", for example, as illustrated in FIG. 10. However, the first to fourth buffers 31a to 31d may include an operational amplifier with an amplification ratio other than "1". The first to fourth capacitors 33a to 33d may be variable capacitors illustrated in FIG. 7.

Each of the first to eighth switches 32a to 32h includes, for example, an N-channel MOS transistor, and the respective first to eighth switches 32a to 32h are substantially equal. Therefore, the first to eighth switches 32a to 32h turn on in response to a control signal at H level, and turn off in response to a control signal at L level.

The first, fourth, sixth and seventh switches 32a, 32d, 32f, 32g (hereinafter referred to as the first switch group) and the second, third, fifth and eighth switches 32b, 32c, 32e, 32h (hereinafter referred to as the second switch group) turn on/off complementary to each other. The second switch group receives a second control signal SG2 which is an inversion of a first control signal SG1 for switching the first switching group. Therefore, the first and second switches 32a, 32b; the third and fourth switches 32c, 32d; the fifth and sixth switches 32e, 32f; and the seventh and eighth switches 32g, 32h turn on/off complementary to each other.

Figure 11:
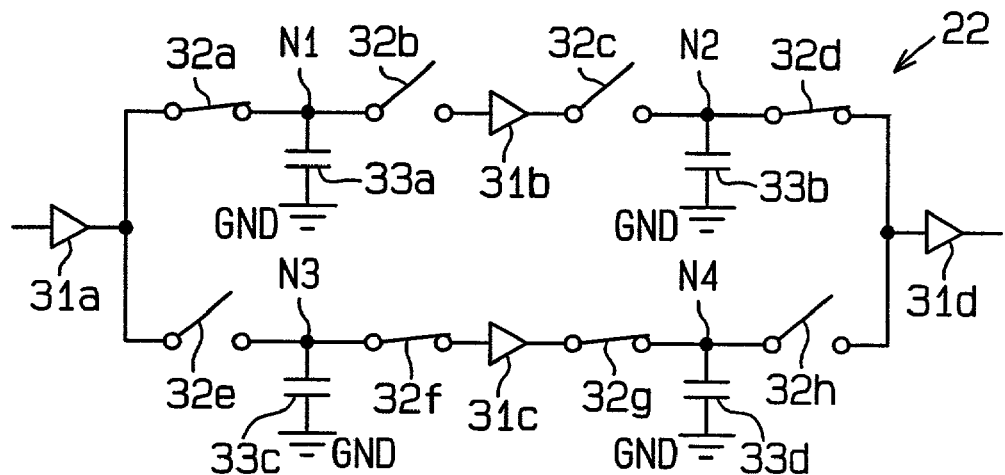
FIG. 11 is a circuit diagram for explaining the operation of the delay circuit in FIG. 9.

As illustrated in FIG. 11, when the first switch group is turned on, for example, in response to the first control signal SG1 at H level, the second switch group is turned off. In this event, a signal value (voltage) of an analog input signal IN supplied to the first buffer 31a is held on the first capacitor 33a through the first switch 32a which has turned on. A voltage held on the second capacitor 33b is supplied to the fourth buffer 31d through the fourth switch 32d which has turned on. A voltage held on the third capacitor 33c is held on the fourth capacitor 33d through the sixth and seventh switches 32f, 32g, which have turned on, and the third buffer 31c.

Figure 12:
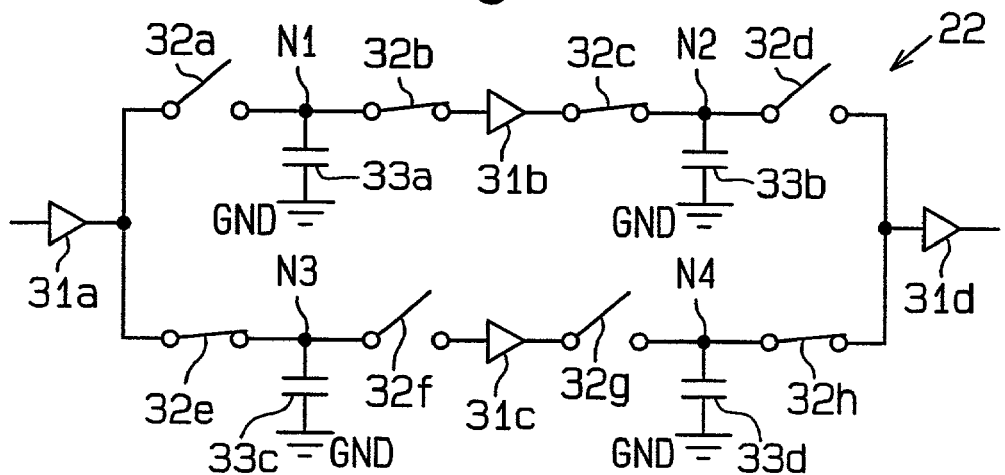
FIG. 12 is a circuit diagram for explaining the operation of the delay circuit in FIG. 9.

As illustrated in FIG. 12, when the first switch group is turned off in response to the first control signal SG1 at L level, the second switch group is turned on. In this event, a voltage held on the first capacitor 33a is held on the second capacitor 33b through the second and third switches 32b, 32c, which have turned on, and the second buffer 31b. A voltage supplied to the first buffer 31a is held on the third capacitor 33c through the fifth switch 32e which has turned on. A voltage held on the fourth capacitor 33d is supplied to the fourth buffer 31d through the eighth switch 32h which has turned on.

Figure 13:
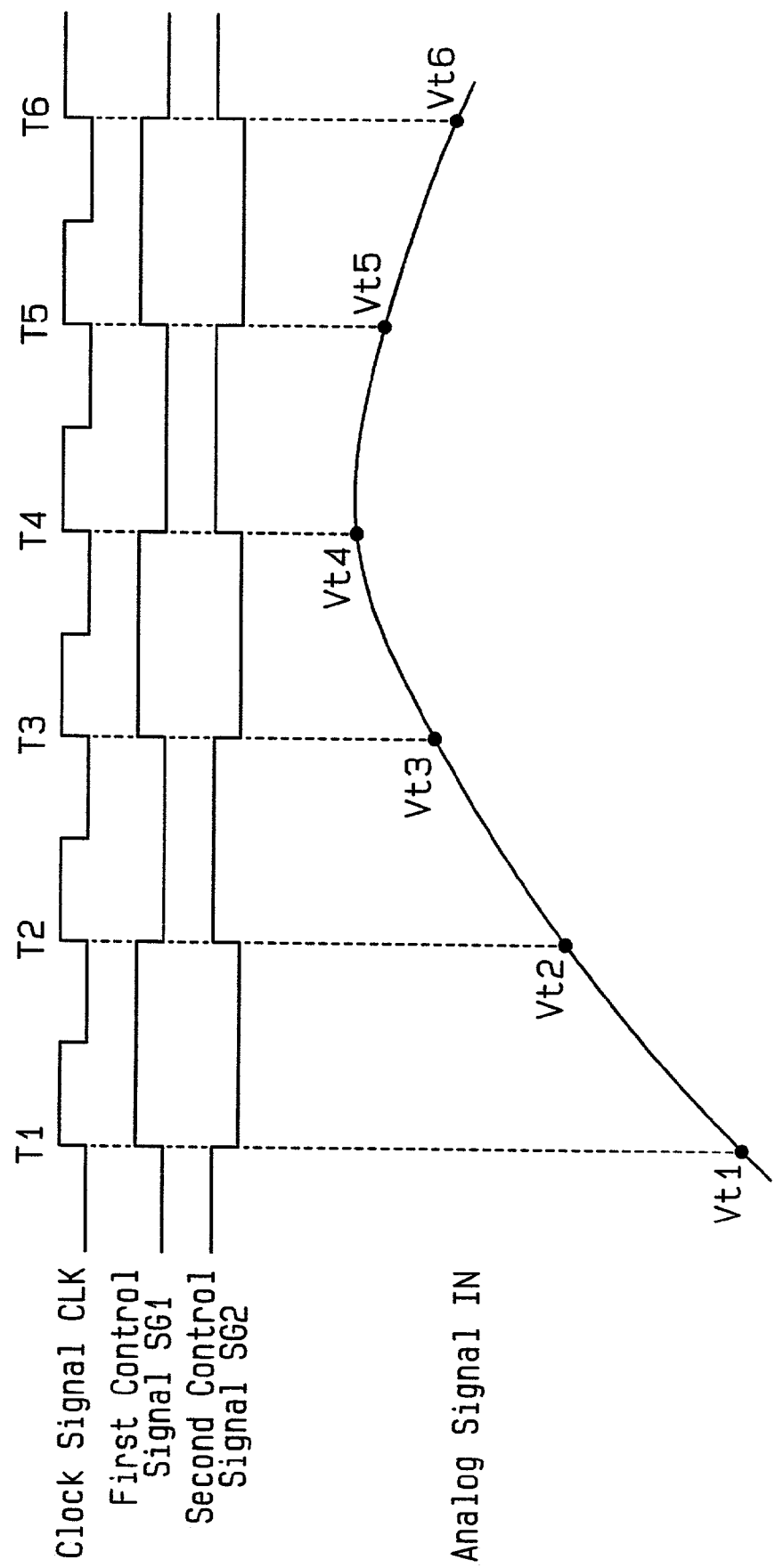
FIG. 13 is a waveform chart showing respective input signals to the delay circuit in FIG. 9.

FIG. 13 is a waveform chart showing respective input signals to the delay circuit 22.

The first control signal SG1 and the second control signal SG2 are generated in accordance with the clock signal CLK. At times T1, T2, T3, T4, T5, T6 in FIG. 12, the ADC 14 samples a signal value (voltage) of an analog input signal IN. In this event, respective samples and held voltages are Vt1, Vt2, Vt3, Vt4, Vt5, Vt6, respectively.

When the analog input signal IN is sampled in response to a rising edge (at time T1 to T6) of the clock signal CLK, the first and second control signals SG1, SG2 have a frequency half that of the clock signal CLK.

FIGS. 14 to 19 illustrate the operation of the delay circuit 22 in response to the first and second control signals SG1, SG2.

Figure 14:
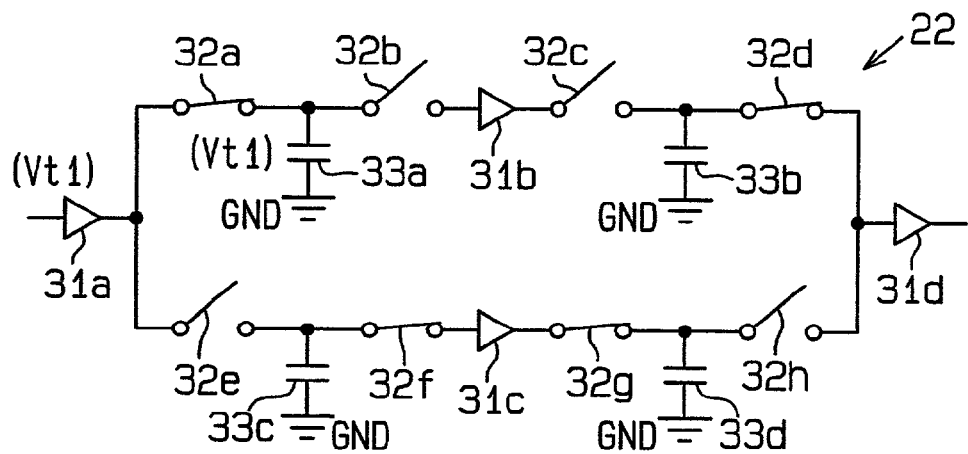
FIGS. 14-19 are circuit diagrams illustrating an operating state of the delay circuit in FIG. 9.

At time T1 in FIG. 13, the first switch group is turned on in response to the first control signal SG1 at H level, while the second switch group is turned off in response to the second control signal SG2 at L level. In this event, as illustrated in FIG. 14, the voltage Vt1 supplied to the first buffer 31a is held on the first capacitor 33a through the first switch 32a which has turned on.

Figure 15:
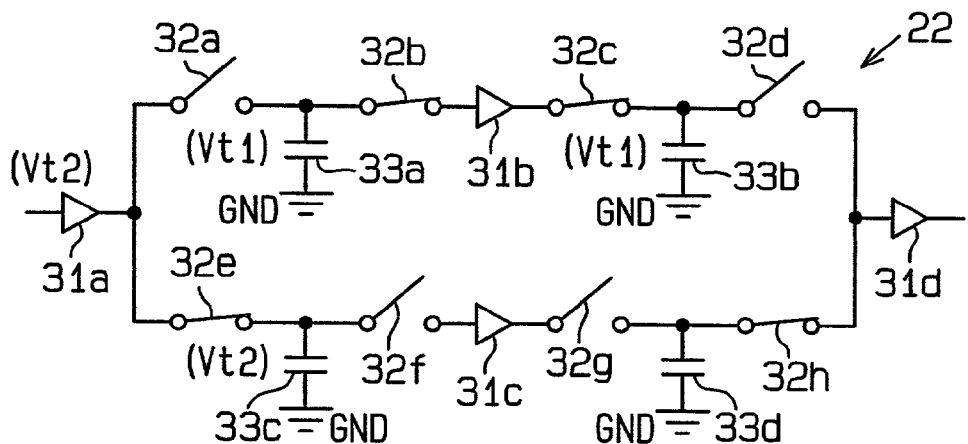

Next, at time T2, the first switch group is turned off in response to the first control signal at L level, while the second switch group is turned on in response to the second control signal SG2 at H level. In this event, as illustrated in FIG. 15, the voltage Vt1 held on the first capacitor 33a is held on the second capacitor 33b through the second and third switches 32b, 32c, which have turned on, and the second buffer 31b. Further, the voltage Vt2 supplied to the first buffer 31a is held on the third capacitor 33c through the fifth switch 32e which has turned on.

Figure 16:
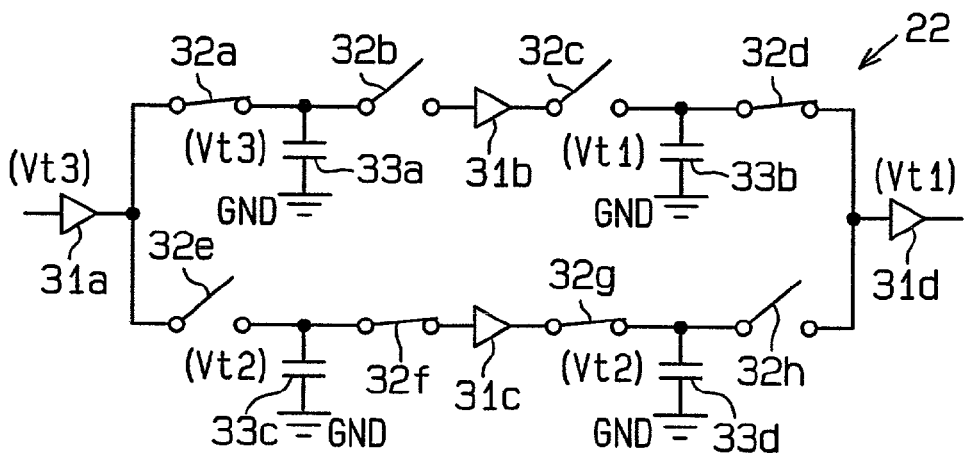

Next, at time T3, the first switch group is turned on in response to the first control signal SG1 at H level, while the second switch group is turned off in response to the second control signal SG2 at L level. In other words, the switching state of the delay circuit 22 at time T3 is substantially equal to that at time T1. In this event, as illustrated in FIG. 16, the voltage Vt1 held on the second capacitor 33b is supplied to the fourth buffer 31d through the fourth switch 32d which has turned on. The voltage Vt2 held on the third capacitor 33c is held on the fourth capacitor 33d through the sixth and seventh switches 32f, 32g, which have turned on, and the third buffer 31c. Further, the voltage Vt3 supplied to the first buffer 31a at this time is held on the first capacitor 33a through the first switch 32a which has turned on.

Figure 17:
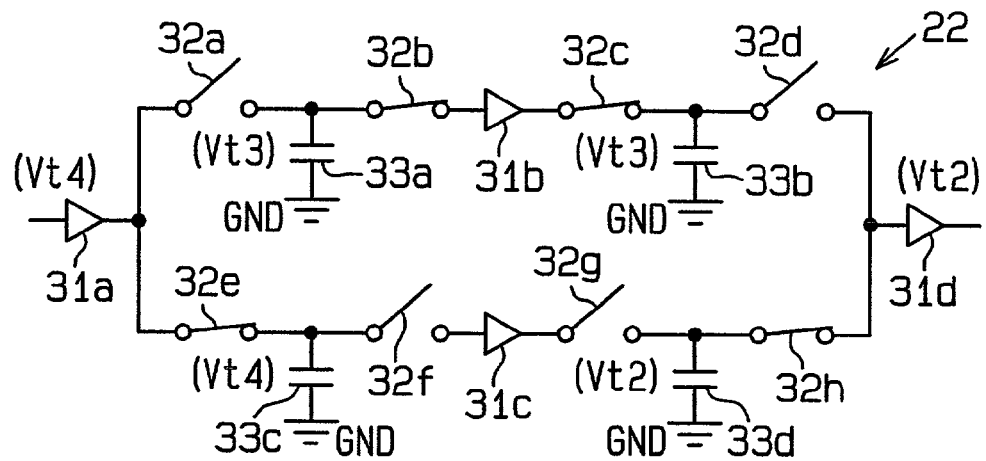
Figure 18:
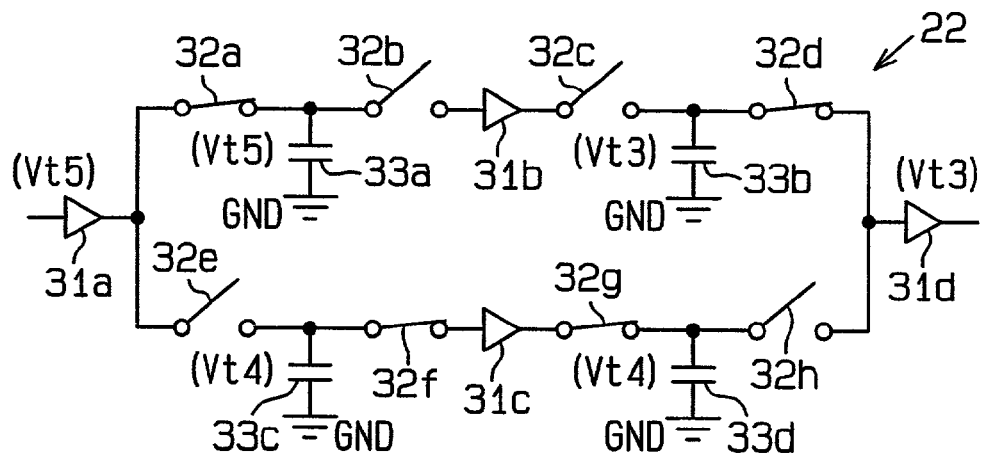
Figure 19:
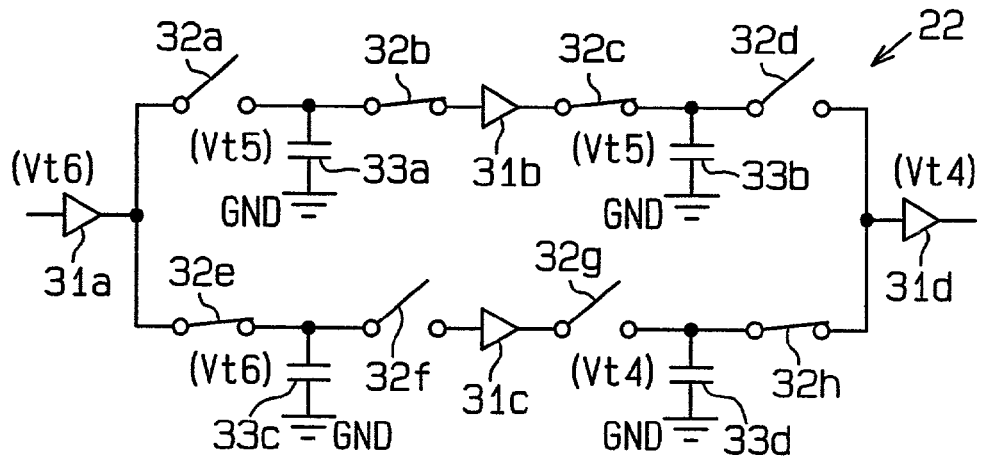

Subsequently, in a similar manner, the first switch group and the second switch group are alternately turned on and off at times T4 to T6, so that the voltages Vt4 to Vt6 supplied to the first buffer 31a are transmitted to switches, which have turned on, and buffers, as illustrated in FIGS. 17 to 19. At each time T4, T5, T6, the voltages Vt2, Vt3, Vt4 are sequentially supplied to the fourth buffer 31d.

Figure 20:
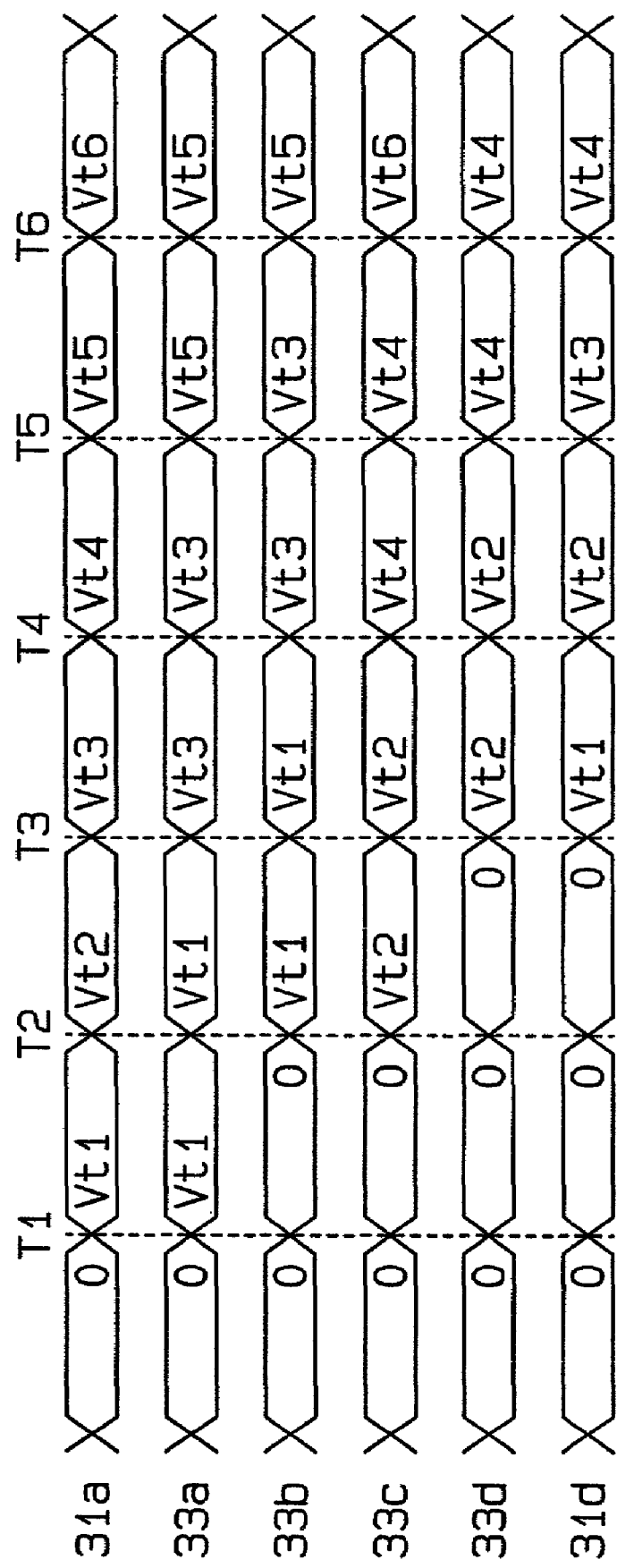
FIG. 20 is a timing chart showing a delay of an analog signal.

FIG. 20 is a timing chart illustrating delays for signal values (voltages Vt1 to Vt6) of the analog input signal IN.

As illustrated in FIG. 20, the voltage Vt1 supplied to the first buffer 31a at time T1 is supplied to the fourth buffer 31d at time T3. In this event, the voltage vt1 is delayed by two clock pulses of the clock signals CLK, and the delayed voltage Vt1 is supplied to the fourth buffer 31d. The voltages Vt2 to Vt6 sequentially supplied to the first buffer 31a at times T2 to T6 are similarly delayed by two clock pulses of the clock signal CLK, and the delayed voltages Vt2 to Vt6 are sequentially supplied to the fourth buffer 31d.

The analog signal controller 21 of the second embodiment has the following advantage.

The delay circuit 22 delays the analog input signal IN in accordance with the clock signal CLK. For this reason, the delay circuit 22 can accurately delay the analog input signal IN, and a delay in the control timing is prevented for the analog input signal IN.

Third Embodiment

Figure 21:
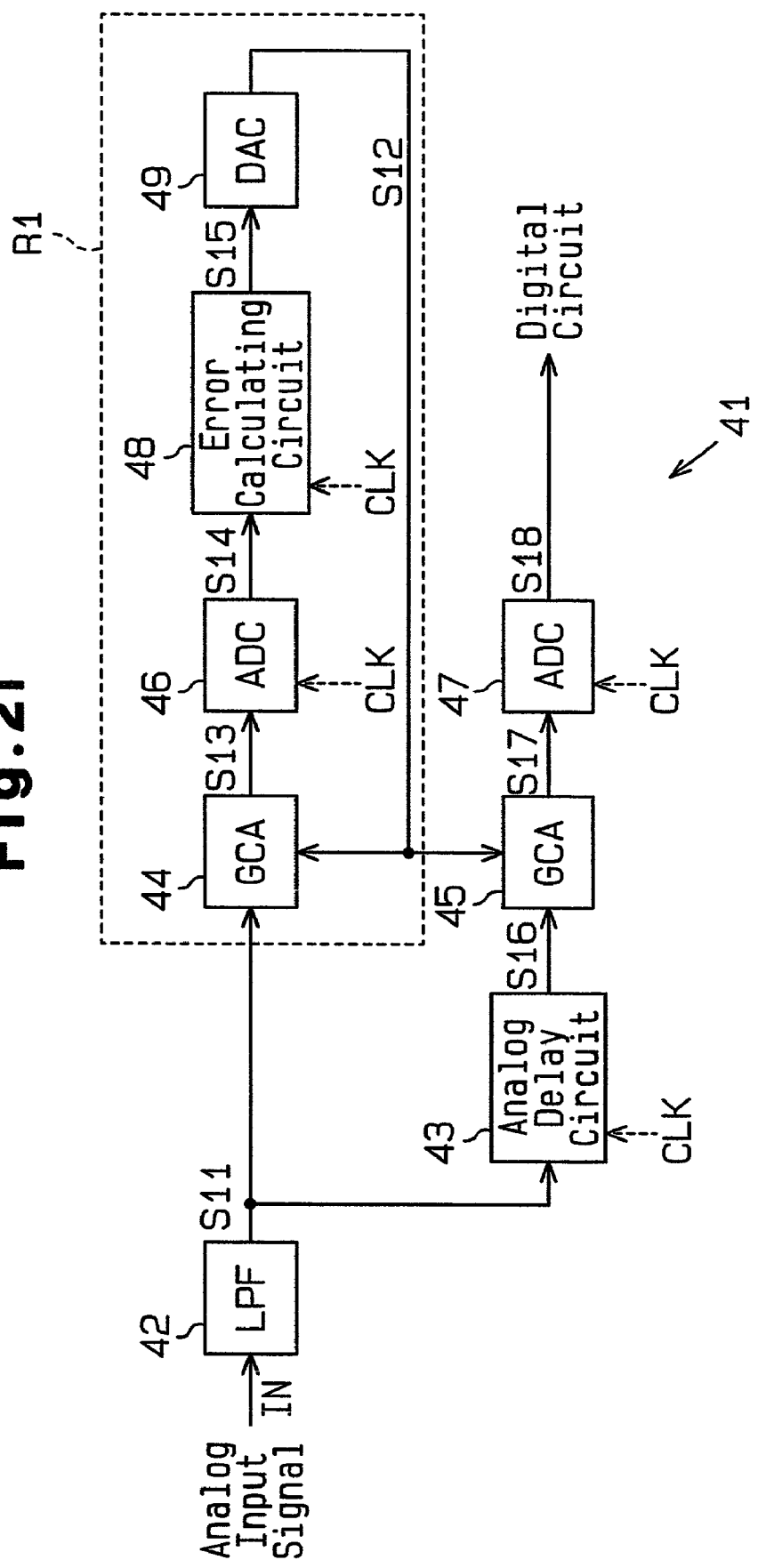
FIG. 21 is a schematic block diagram of an AGC according to a third embodiment of the present invention.

FIG. 21 is a schematic block diagram of an automatic gain controller (hereinafter referred to as AGC) 41 according to a third embodiment of the present invention. The analog signal controller 21 of the second embodiment is applied to the AGC 41.

The AGC 41 includes a low pass filter (hereinafter referred to as LPF) 42, an analog delay circuit (hereinafter referred to as delay circuit) 43, a first and a second gain control amplifier (hereinafter referred to as GCA) 44, 45, a first and a second A/D converter circuit (hereinafter referred to as ADC) 46, 47, an error calculating circuit 48, and a D/A converter circuit (hereinafter referred to as DAC) 49.

The GCA 44, the ADC 46, the error calculating circuit 48 and the DAC 49 form a control loop (first control loop) R1. A control signal (an output signal of the DAC 49) S12 for the control loop R1 is fed back to the first GCA 44 and the second GCA 45. The delay circuit 43, the first and second ADCs 46, 47, and the error calculating circuit 48 operate in accordance with a clock signal CLK supplied from a PLL circuit, not shown.

The analog input signal IN is supplied to the LPF 42. The LPF 42 removes high frequency components from the analog input signal IN to generate an analog signal S11 which is supplied to the first GCA 44 and the delay circuit 43.

The first GCA 44 sets a first gain in accordance with the control signal S12. The first GCA 44 amplifies the analog signal S11 in accordance with the first gain to generate a first amplified analog signal S13 which is supplied to the first ADC 46. The first ADC 46 analog-to-digital converts the first amplified analog signal S13 to generate a digital signal S14. The digital signal S14 is supplied to the error calculating circuit 48.

Figure 2:
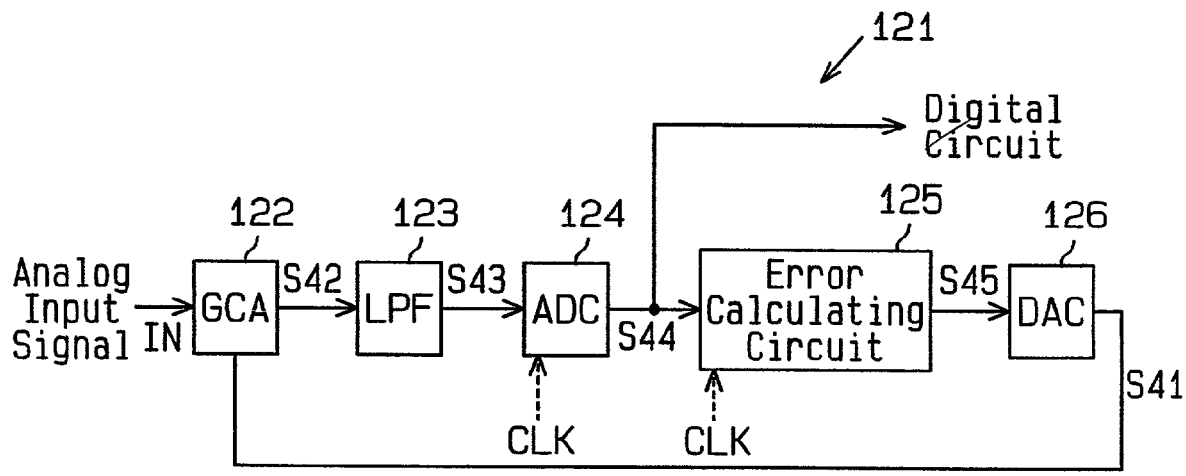
FIG. 2 is a schematic block diagram of a conventional AGC.
Figure 3:
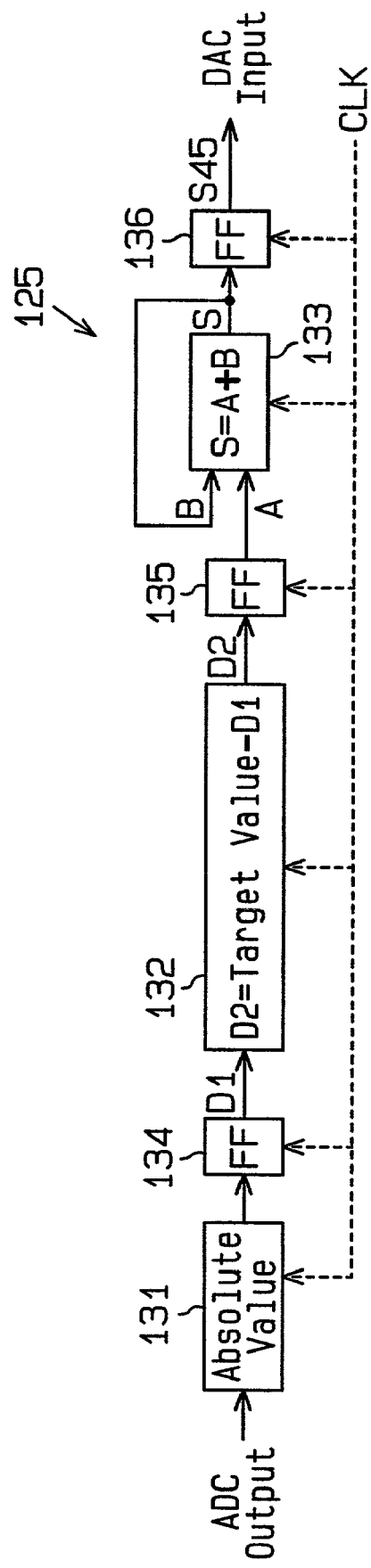
FIG. 3 is a schematic block diagram of an error calculating circuit included in the AGC of FIG. 2.
Figure 4:
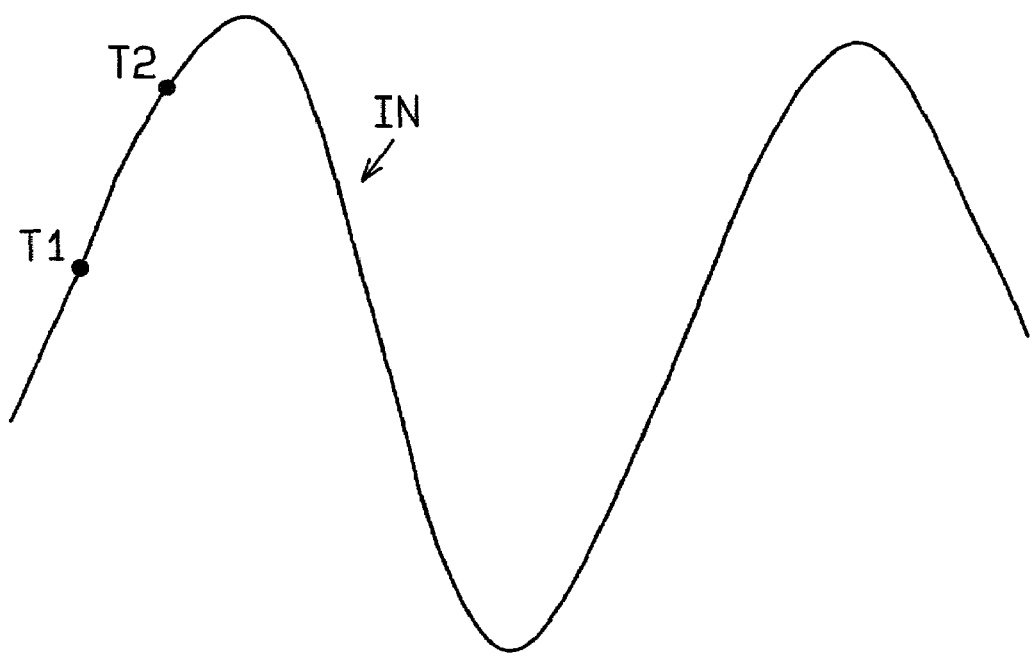
FIG. 4 is a timing waveform chart associated with the conventional AGC.

The error calculating circuit 48 compares the digital signal S14 with a predetermined target value, and integrates an error component resulting from the comparison to generate an error digital signal S15. The error digital signal S15 is supplied to the DAC 49. The target value is such a value that causes the amplitude of the amplified analog signal S13 to substantially cover the full range of the input level of the first ADC 46. The error calculating circuit 48 is substantially equal in configuration to the error calculating circuit 125 in FIG. 2.

The DAC 49 digital-to-analog converts the error digital signal S15 to generate a control signal S12. That is, the control loop R1 generates the control signal S12 in accordance with the first amplified analog signal S13 of the first GCA 44, and optimizes the gain of the first GCA 44 in accordance with the control signal S12.

A latency caused by the control loop R1 is substantially equal to a latency caused by the error calculating circuit 48.

For this reason, the delay circuit 43 generates a delay which corresponds to the latency caused by the error calculating circuit 48.

Specifically, the delay circuit 43 delays the analog signal S11 in synchronism with the clock signal CLK. The delay circuit 43 includes three delay stages (see FIG. 9) connected in series, for generating a delay equal to three clock pulses of the clock signal CLK. The delay circuit 43 delays the analog signal S11 by a time corresponding to three clock pulses of the clock signal CLK in accordance with the clock signal CLK to generate a delayed analog signal S16. The delayed analog signal S16 is supplied to the second GCA 45.

The second GCA 45 sets a second gain in accordance with the feedback signal S12. The second GCA 45 amplifies the delayed analog signal S16 in accordance with the second gain to generate a second amplified analog signal S17. The second amplified analog signal S17 is supplied to the second ADC 47. The second ADC 47 analog-to-digital converts the second amplified analog signal S17 to generate a second digital signal S18. The second digital signal S18 is supplied to a digital circuit (next circuit).

When the next circuit is an analog circuit, the analog circuit is supplied with the second amplified analog signal S17 from the second GCA 45.

Next, the action of the AGC 41 will be described.

The analog signal S11 is supplied to the first GCA 44 and delay circuit 43 in the control loop R1. In the control loop R1, an error is calculated for the first amplified analog signal S13 generated by the first GCA 44, and the control signal S12 generated to optimize the gain of the first GCA 44 is fed back to the first GCA 44. The control signal S12 is supplied to the second GCA 45.

The second GCA 45 receives the delayed analog signal S16 from the delay circuit 43. A delay substantially equal to the latency in the control loop R1 has been set in the delay circuit 43. For this reason, the second GCA 45 amplifies the delayed analog signal S16 with a predetermined amplification ratio in accordance with the control signal S12 to generate the second amplified analog signal S17, without being affected by the latency caused by the control loop R1.

In the AGC 41, the second GCA 45 is supplied as appropriate with the control signal S12 for controlling the delayed analog signal S16 irrespective of the latency caused by the control loop R1.

In the third embodiment, the delay circuit 43 may generate the delayed analog signal S16 which is delayed by the latency in the control loop R1. For example, the number of delay stages may be increased. In this case, a signal value of the delayed analog signal S16 to be controlled can be controlled by the control signal S12 which is generated in consideration of a signal value which is sampled after a signal value to be controlled. As a result, a more accurate analog signal control can be realized.

The AGC 41 of the third embodiment has the following advantage.

The delay circuit 43 generates the delayed analog signal S16 which is delayed by a time substantially equal to the latency in the control loop R1. The second GCA 45 relies on the control signal S12 to control the delayed analog signal S16 which has a signal value substantially equal to the analog signal S11 that is sampled in the control loop R1. Therefore, a delay in the control timing is prevented for the analog input signal IN, thereby making it possible to accomplish a highly accurate analog signal control.

Fourth Embodiment

Figure 22:
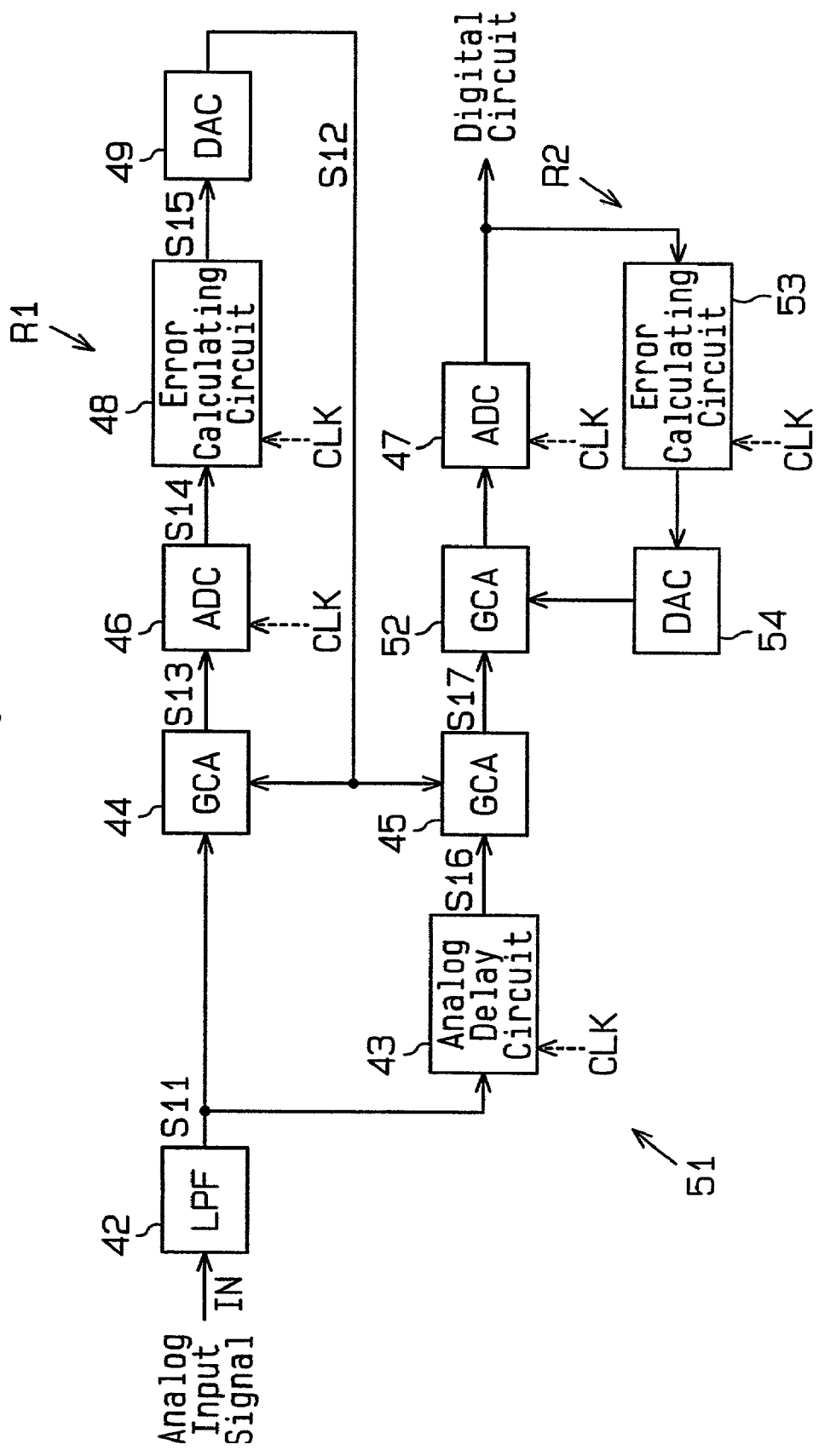
FIG. 22 is a schematic block diagram of an AGC according to a fourth embodiment of the present invention.

FIG. 22 is a schematic block diagram of an AGC 51 according to a fourth embodiment of the present invention. The analog signal controller 21 of the second embodiment is applied to the AGC 51. The AGC 51 of the fourth embodiment further includes a third GCA 52, a second error calculating circuit 53, and a second DAC 54, in addition to the configuration of the AGC 41 in the third embodiment.

The third GCA 52, the second ADC 47, the second error calculating circuit 53, and the second DAC 54 form a second control loop R2. The second control loop is connected to the second GCA 45. The second control loop R2 is substantially equal in function to the first control loop R1.

In the AGC 51, a second amplified analog signal S17 generated by the second GCA 45 is further subjected to an error calculation through the second control loop R2 to optimize the gain of the third GCA 52. For this reason, the second amplified analog signal S17 can be satisfactorily provided with an amplitude corresponding to the input range of the second ADC 47.

In the fourth embodiment, first, the second GCA 45, which is robust to the latency, roughly controls the gain, followed by the third GCA 52 which finely controls the gain. Therefore, the analog signal control is less affected by the latency caused by the control loop R2.

The AGC 51 of the fourth embodiment has the following advantage.

The second control loop R2 again calculates an error for the second amplified analog signal S17. It is therefore possible to more finely control the gain as compared with the AGC 41 of the third embodiment. Since the third GCA 52 controls the second amplified analog signal S17 which has been roughly controlled by the second GCA 45 for gain control, the analog signal control is less affected by the latency caused by the control loop R2.

Fifth Embodiment

Figure 23:
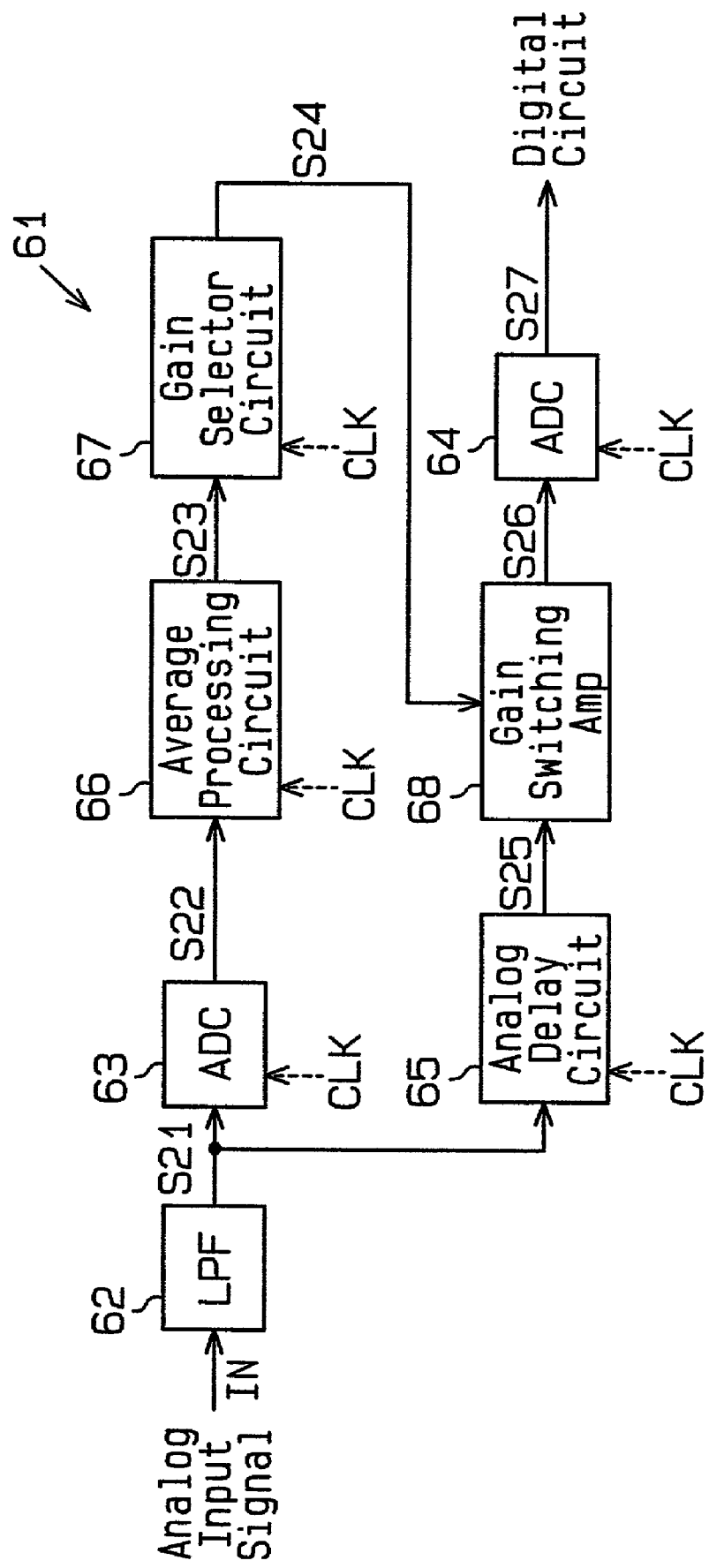
FIG. 23 is a schematic block diagram of an AGC according to a fifth embodiment of the present invention.

FIG. 23 is a schematic block diagram of an AGC 61 according to a fifth embodiment of the present invention. The analog signal controller 21 of the second embodiment is applied to the AGC 61. The AGC 61 of the fifth embodiment includes an LPF 62, a first and a second ADC 63, 64, an analog delay circuit (hereinafter referred to as delay circuit) 65, an average processing circuit 66, a gain selector circuit 67, and a gain switching amplifier 68. The first and second ADCs 63, 64, the delay circuit 65, the average processing circuit 66, and the gain selector circuit 67 operate in accordance with the clock signal CLK.

An analog input signal IN is supplied to the LPF 62. The LPF 62 removes high frequency components from the analog input signal IN to generate an analog signal S21. The analog signal S21 is supplied to the first ADC 63 and the delay circuit 65.

The first ADC 63 samples and holds the analog signal S21, and analog-to-digital converts the analog signal S21 to generate a digital signal S22. The digital signal S22 is supplied to the average processing circuit 66. The average processing circuit 66 calculates an average value of a sampling value in accordance with the digital signal S22, which has the sampling value, to generate an average value signal S23. The average value signal S23 is supplied to the gain selector circuit 67.

The gain selector circuit 67 selects a gain for the gain switching amplifier 68 in accordance with the average value signal S23, and generates a gain switching signal (control signal) S24. The gain switching signal S24 is supplied to the gain switching amplifier 68. The gain switching amplifier 68 switches the gain in accordance with the gain switching signal S24.

The delay circuit 65 applies the analog signal S21 with a delay corresponding to a latency occurring in the first ADC 63, the average processing circuit 66 and the gain selector circuit 67 to generate a delayed analog signal S25. The delay circuit 65 delays the analog signal S21 by a period equal to a number of clock pulses of the clock signal CLK corresponding to the latency.

The gain switching amplifier 68 amplifies the delayed analog signal S25 in accordance with a gain switched by the gain switching signal S24 to generate an amplified analog signal S26. The amplified analog signal S26 is supplied to the second ADC 46. In this event, the gain switching amplifier 68 amplifies the delay analog signal S25 which has substantially the same value as the signal value of the analog signal S21.

The second ADC 64 analog-to-digital converts the amplified analog signal S26 to generate a digital signal S27. The digital signal S27 is supplied to a digital circuit (next circuit). When the next circuit is an analog circuit, the analog circuit receives the amplified analog signal S26 from the gain switching amplifier 68.

Figure 24:
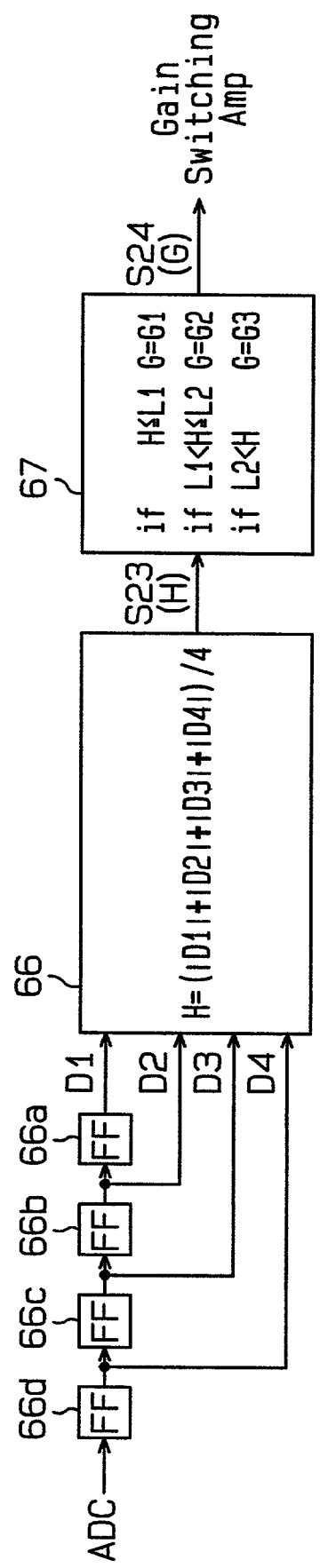
FIG. 24 is a schematic block diagram of an average processing circuit and a gain selector circuit in the AGC of FIG. 23.

FIG. 24 is a schematic block diagram of the average processing circuit 66 and the gain selector circuit 67.

The average processing circuit 66 includes a plurality (for example, four) of flip-flops (hereinafter referred to as FFs) 66a to 66d which are connected in series on the input side. In the fifth embodiment, the average processing circuit 66 calculates an average value of four sampling values which are sampled by the first ADC 63.

Specifically, the FFs 66a to 66d latch sampling values D1 to D4, sampled by the first ADC 63, respectively, to output latched sampling values D1 to D4. The average processing circuit 66 calculates an average value H of these sampling values D1 to D4 to generate the average value signal S23 which has information on the average value H.

A gain G corresponding to the average value H calculated by the average processing circuit 66 has been previously set in the gain selector circuit 67. For example, the gain selector circuit 67 selects the gain G=G1 (for example, twice) when the average value H is equal to or lower than a first reference value L1; the gain G=G2 (for example, unity gain) when the average value H is higher than the first reference value L1 and equal to or lower than a second reference value L2; and the gain G=G3 (for example, 0.5 times) when the average value H is higher than the second reference value L2.

The first and second reference values L1, L2 have been previously set in the gain selector circuit 67 corresponding to a signal value of the analog signal S1 sampled by the first ADC 63. The gain selector circuit 67 selects any of the gains G=G1–G3 in accordance with the calculated average value H, and generates the gain switching signal S24 which has information on the selected gain G.

The delay circuit 65 in the AGC 61 delays the analog signal S21 by a delay time substantially equal to a latency caused by the average processing circuit 66 and the gain selector circuit 67. Specifically, the delay circuit 65 includes, for example, four delay stages connected in series for generating a delay of four clock pulses of the clock signal CLK, corresponding to the four FFs 66a to 66d.

The average processing circuit 66 and the gain selector circuit 67 operate at high speeds. Therefore, FFs having a pipeline function may be provided on the output side of the gain selector circuit 67. In this case, the number of delay stages in the delay circuit 65 is changed as appropriate in accordance with the number of FFs provided on the output side.

Next, the action of the AGC 61 will be described.

Figure 25:
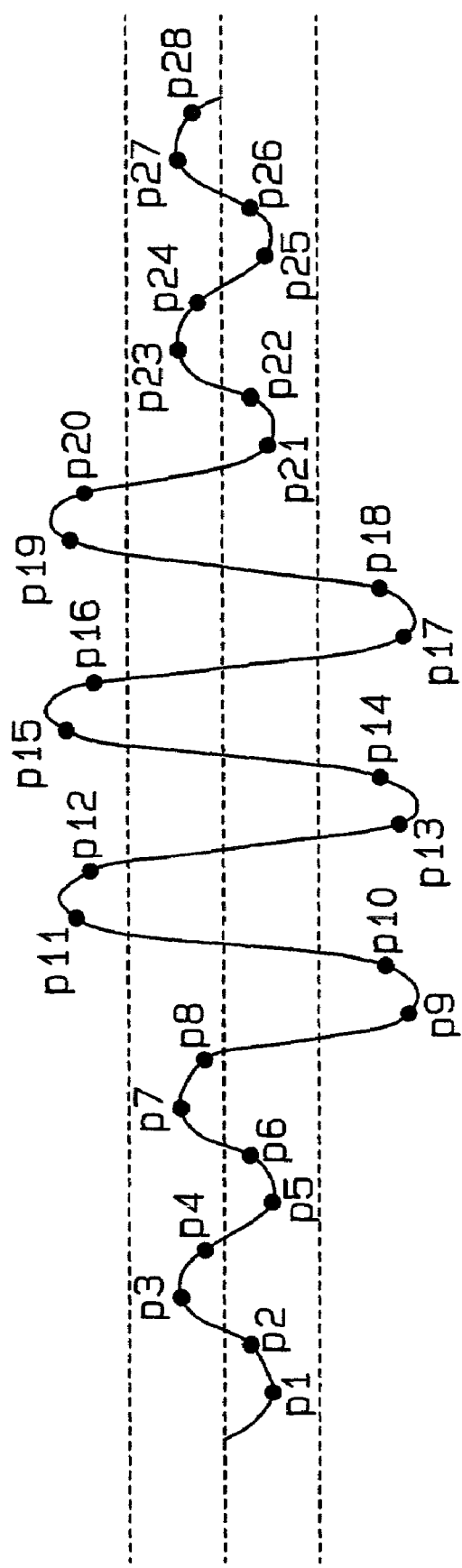
FIG. 25 is a waveform chart showing exemplary sampling of an analog signal.
Figure 26:
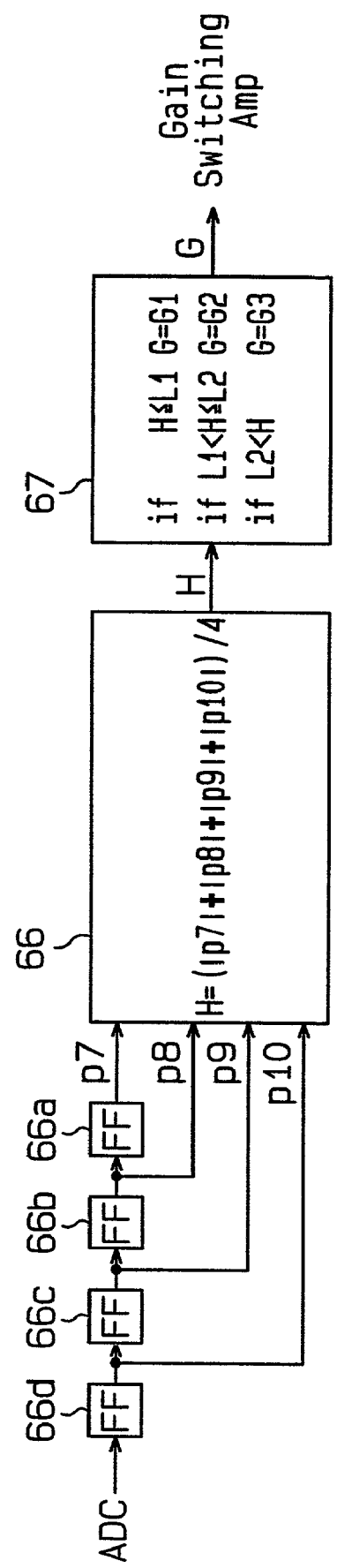
FIG. 26 is a schematic block diagram of the average processing circuit and the gain selector circuit in the AGC of FIG. 23.

FIG. 25 is a waveform chart showing exemplary sampling of an analog signal S21 which is sampled by the first ADC 63. FIG. 25 shows that four signal values are sampled every period of the analog signal S21 (sampling values p1 to p28). FIG. 26 is a schematic block diagram of the average processing circuit 66 for calculating an average value of, for example, the sampling values p7 to p10 out of the sampling values p1 to p28, and the gain selector circuit 67.

Now, the number of connected delay stages in the delay circuit 65 (hereinafter referred to as the number of delay stages) is set to "0" (i.e., no delay is set in the delay circuit 65). In this event, the average processing circuit 66 calculates an average value H of the sampling values p7 to p10, while the gain selector circuit 67 selects the gain G in accordance with the average value H, and generates the gain switching signal S24 which has information on the selected gain G.

The gain switching amplifier 68 amplifies the delayed analog signal S25, which has a value corresponding to the sampling timing (time) of the sampling value p10, in accordance with the gain switching signal S24. Since no delay is set in the delay circuit 65, the gain switching signal S24 acts on the delayed analog signal S25 which has substantially the same value as the signal value corresponding to the sampling timing of the sampling value p10.

When the number of delay stages in the delay circuit 65 is set to "1", the gain switching signal S24 acts on the delayed analog signal S25 which has substantially the same value as the signal value corresponding to the sampling timing of the sampling value p9. Also, when the number of delay stages in the delay circuit 65 is set to "2", the gain switching signal S24 acts on the delayed analog signal S25 which has substantially the same value as the signal value corresponding to the sampling timing of the sampling value p8.

In other words, the AGC 61 of the fifth embodiment can force the gain switching signal S24 generated in accordance with an average value of a plurality of sampling values to act on an arbitrary signal value of the delayed analog signal S25 by changing the number of delay stages in the delay circuit 65.

When the delay circuit 65 has a plurality of delay stages for generating a delay equal to or larger than the latency caused by the average processing circuit 66 and the gain selector circuit 67, the gain switching signal S24 can be generated in consideration of a sampling value which is sampled after a signal value of the delay analog signal S25 to be controlled. For example, when the delay circuit 65 has four delay stages connected in series, the gain switching signal S24 generated based on the average value H of the sampling values p7 to p10 can act on the delayed analog signal S25 which has a value corresponding to the sampling timing of the sampling value p6.

The AGC 61 of the fifth embodiment has the following advantages.

(1) The average processing circuit 66 calculates the average value H of a plurality of sampling values. The gain selector circuit 67 selects the gain G in accordance with the average value H, and generates the gain switching signal S24 which is used to switch the gain of the gain switching amplifier 68. The delay circuit 65 delays the analog signal S21 corresponding to the latency in the first ADC 63, the average processing circuit 66 and the gain selector circuit 67. It is therefore possible to prevent a delay in the control timing for the analog input signal IN, and perform a highly accurate analog signal control.

(2) By changing a delay set in the delay circuit 65, the gain switching signal S24 generated in accordance with the average value H of a plurality of sampling values can act on the delayed analog signal S25 which has a value corresponding to any of the plurality of sampling values. A latency equal to or larger than a possible latency can be set in the delay circuit 65. In this case, for a signal value of the delay analog signal S25 to be controlled, the gain switching signal S24 can be generated in consideration of a sampling value which is sampled after the signal value to be controlled. Therefore, a more accurate analog signal control can be accomplished.

Sixth Embodiment

Figure 27:
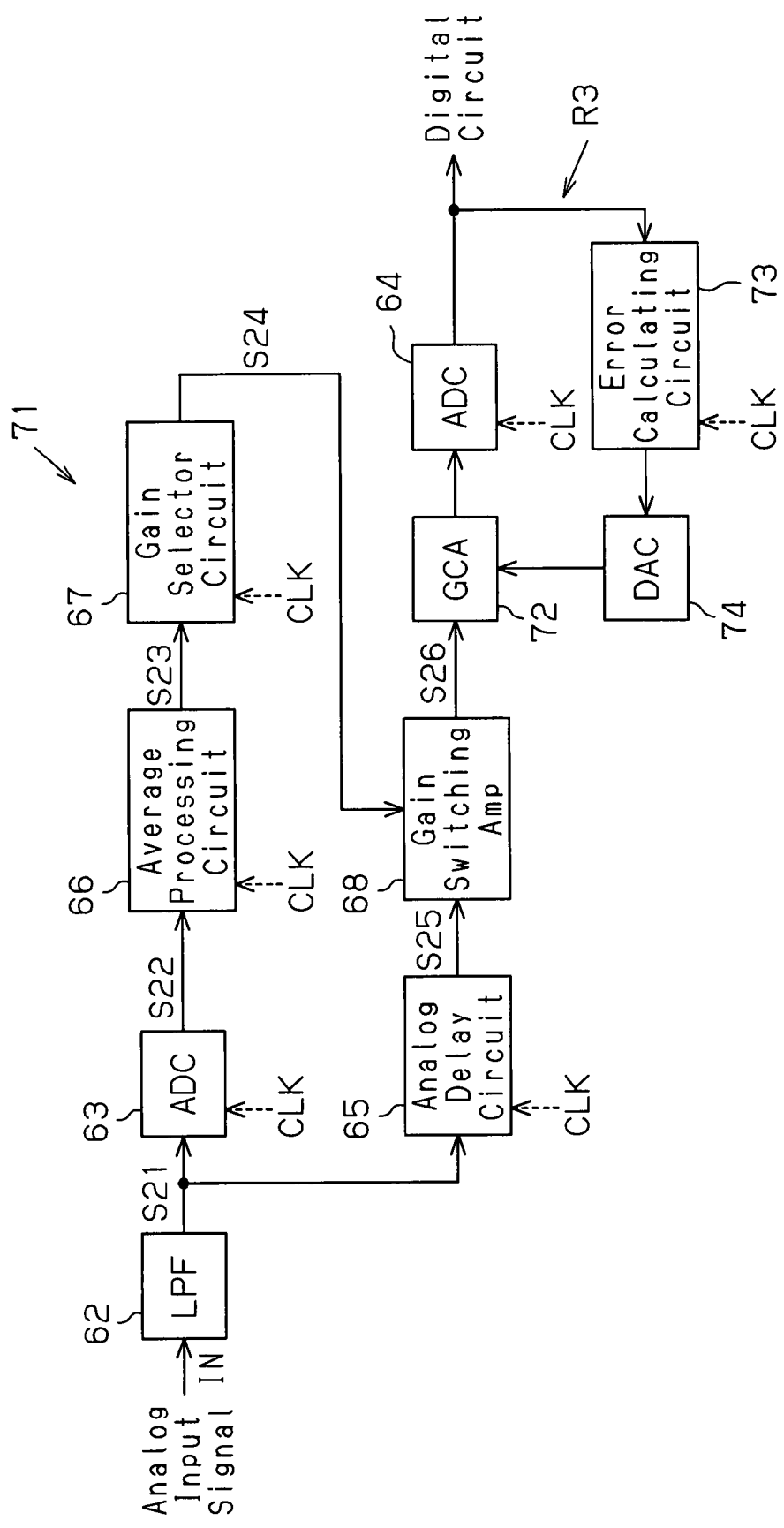
FIG. 27 is a schematic block diagram of an AGC according to a sixth embodiment of the present invention.

FIG. 27 is a schematic block diagram of an AGC 71 according to a sixth embodiment of the present invention. The analog signal controller 21 of the second embodiment is applied to the AGC 71. The AGC 71 of the sixth embodiment further includes a GCA 72, an error calculating circuit 73, and a DAC 74, in addition to the configuration of the AGC 61 in the fifth embodiment.

The GCA 72, the ADC 64, the error calculating circuit 73, and the DAC 54 form a third control loop R3. The third control loop R3 is connected to the gain switching amplifier 68. The third control loop R3 is substantially equal in function to the first and the second control loops R1, R2.

In the AGC 71 of the sixth embodiment, an error is calculated through the third control loop R3 for an amplified analog signal S26 output from the gain switching amplifier 68 to optimize the gain of the GCA 72. For this reason, the analog signal amplified by the GCA 72 can be satisfactorily provided with an amplitude corresponding to the input range of the ADC 64.

A rough gain control is conducted for the gain switching amplifier 68 which is robust to the latency of the third control loop R3, and then a fine gain control is conducted for the GCA 72 in the third control loop R3. Therefore, the analog signal control is less affected by the latency caused by the third control loop R3.

The AGC 71 of the sixth embodiment has the following advantage.

An error is again calculated by the third control loop R3 for the amplified analog signal S26 output from the gain switching amplifier 68. It is therefore possible to more finely control the gain as compared with the AGC 61 of the fifth embodiment. Since the GCA 72 controls the amplified analog signal S26 which has been roughly controlled by the gain switching amplifier 68, the influence of the latency in the third control loop R3 is reduced.

Seventh Embodiment

Figure 28:
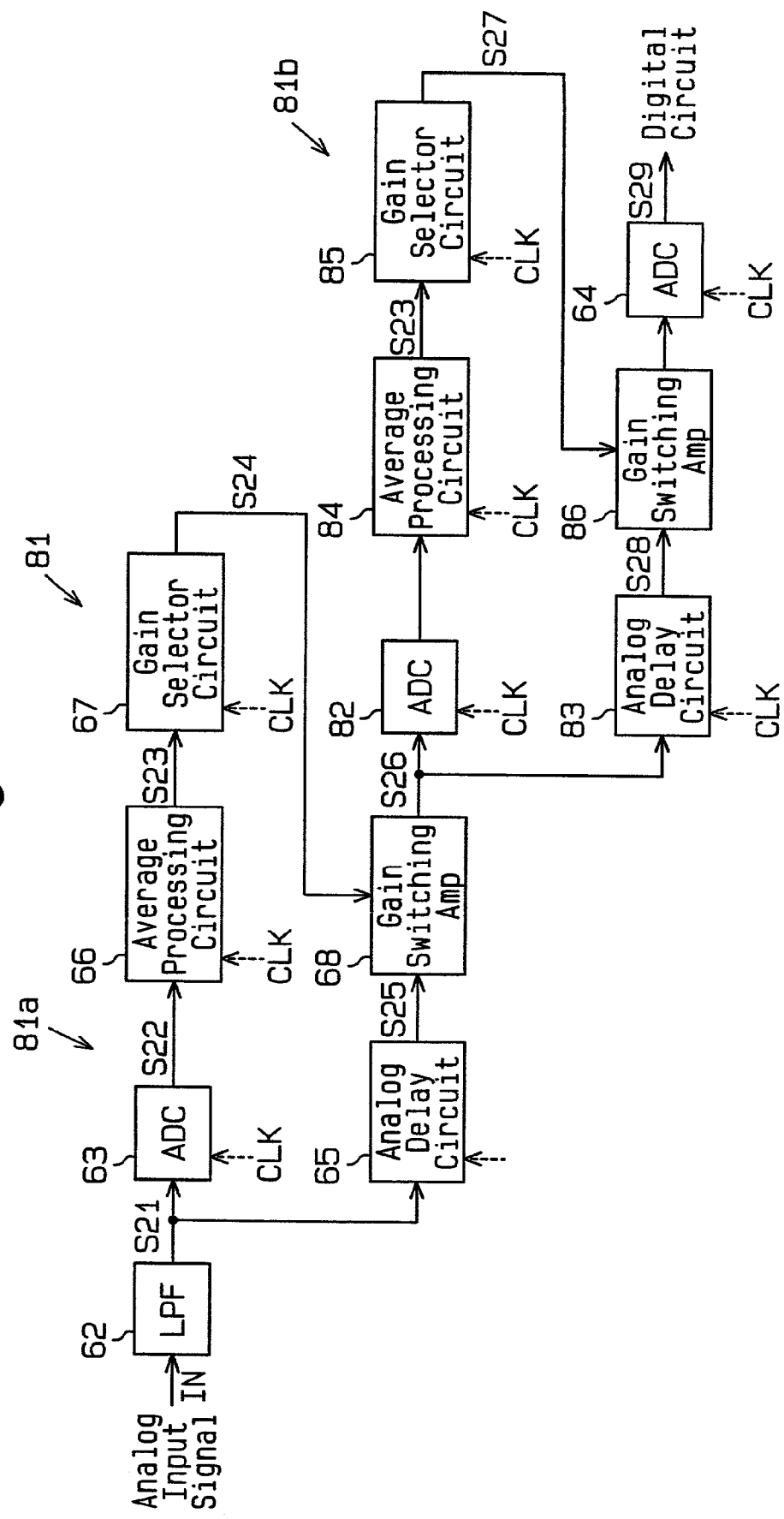
FIG. 28 is a schematic block diagram of an AGC according to a seventh embodiment of the present invention.

FIG. 28 is a schematic block diagram of an AGC 81 according to a seventh embodiment of the present invention. The analog signal controller 21 of the second embodiment is applied to the AGC 81. The AGC 81 of the seventh embodiment includes a first AGC 81a and a second AGC 81b which are connected in series. Each of the first AGC 81a and the second AGC 81b is substantially equal in configuration to the AGC 61 of the fifth embodiment.

The second AGC 81b is connected to a first gain switching amplifier 68 in the first AGC 81a. The second AGC 81b includes a second ADC 82, a second delay circuit 83, a second average processing circuit 84, a second gain selector circuit 85, and a second gain switching amplifier 86.

The AGC 81 roughly controls the gain first by the first gain switching amplifier 68, and then finely controls the gain by the second gain switching amplifier 86. The ADC 64 analog-to-digital converts an analog signal generated by the second switching amplifier 68 to generate a digital signal S29. The digital signal S29 is supplied to a next circuit (digital circuit).

The second gain switching amplifier 86 controls a second delayed analog signal S28 delayed by the second delay circuit 83 in accordance with a second gain switching signal (control signal) S27 generated by the second gain selector circuit 85. Therefore, the control of the second gain switching amplifier 86 will not be affected by a latency caused by the second ADC 82, the second average processing circuit 84 and the gain selector circuit 85.

The AGC 81 of the seventh embodiment has the following advantage.

The AGC 81 includes the first AGC 81a and the second AGC 81b connected in series. Each of the first AGC 81a and the second AGC 81b is substantially equal to the AGC 61 of the fifth embodiment illustrated in FIG. 23. For this reason, the analog signal control can be more finely conducted in accordance with the gain switching signals S24, S27 generated by the AGCs 81a, 81b, respectively.

Eighth Embodiment

Figure 29:
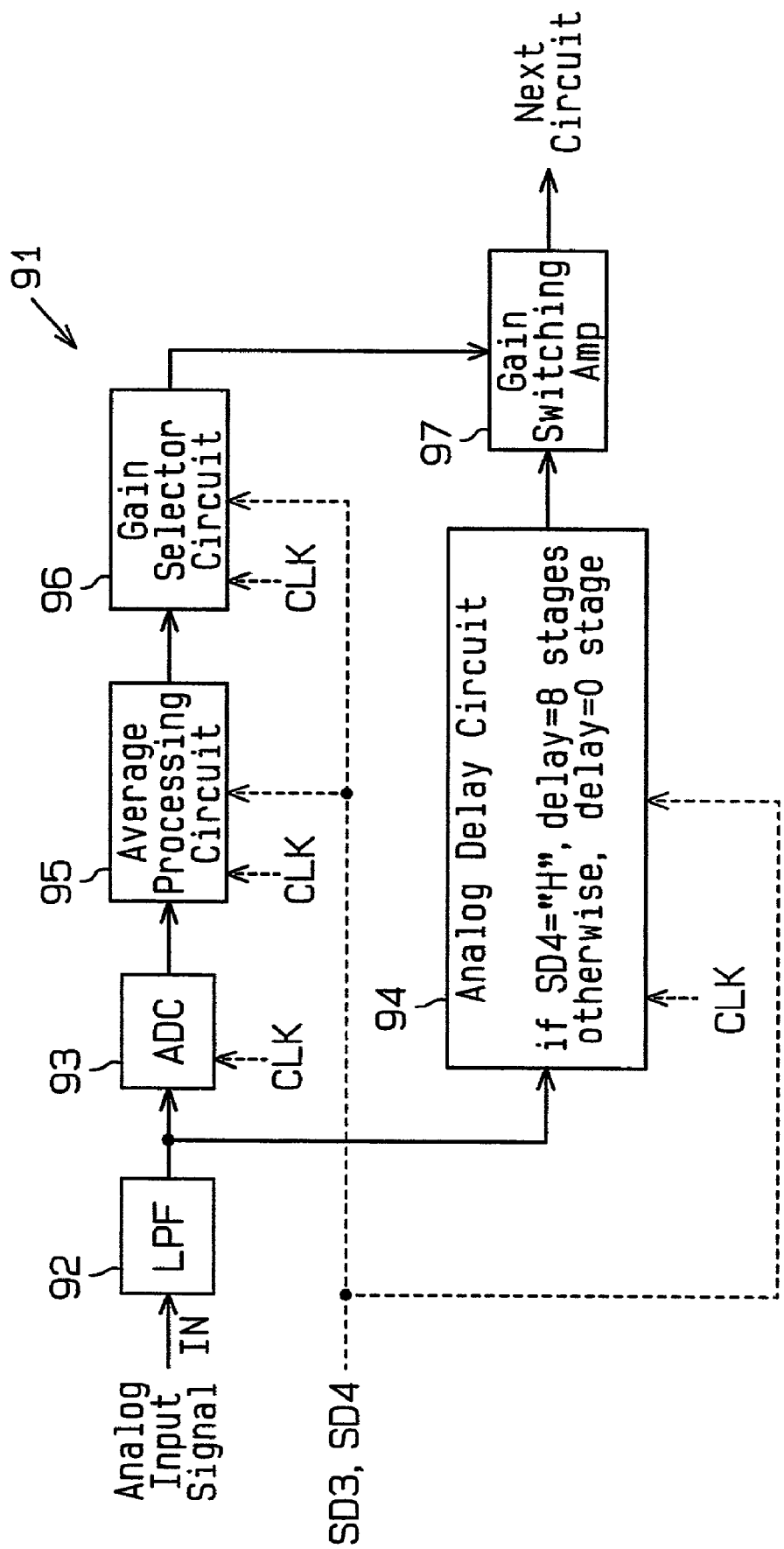
FIG. 29 is a schematic block diagram of an AGC according to an eighth embodiment of the present invention.

FIG. 29 is a schematic block diagram of an AGC 91 according to an eighth embodiment. The analog signal controller 21 of the second embodiment is applied to the AGC 91. The AGC 91 of the eighth embodiment includes an LPF 92, an ADC 93, an analog delay circuit (hereinafter referred to as delay circuit) 94, an average processing circuit 95, a gain selector circuit 96, and a gain switching amplifier 97. The AGC 91 of the eighth embodiment is applied to a control of an analog input signal IN, the characteristic of which is roughly known beforehand, for example, a phase servo control for a hard disk drive.

Figure 30:
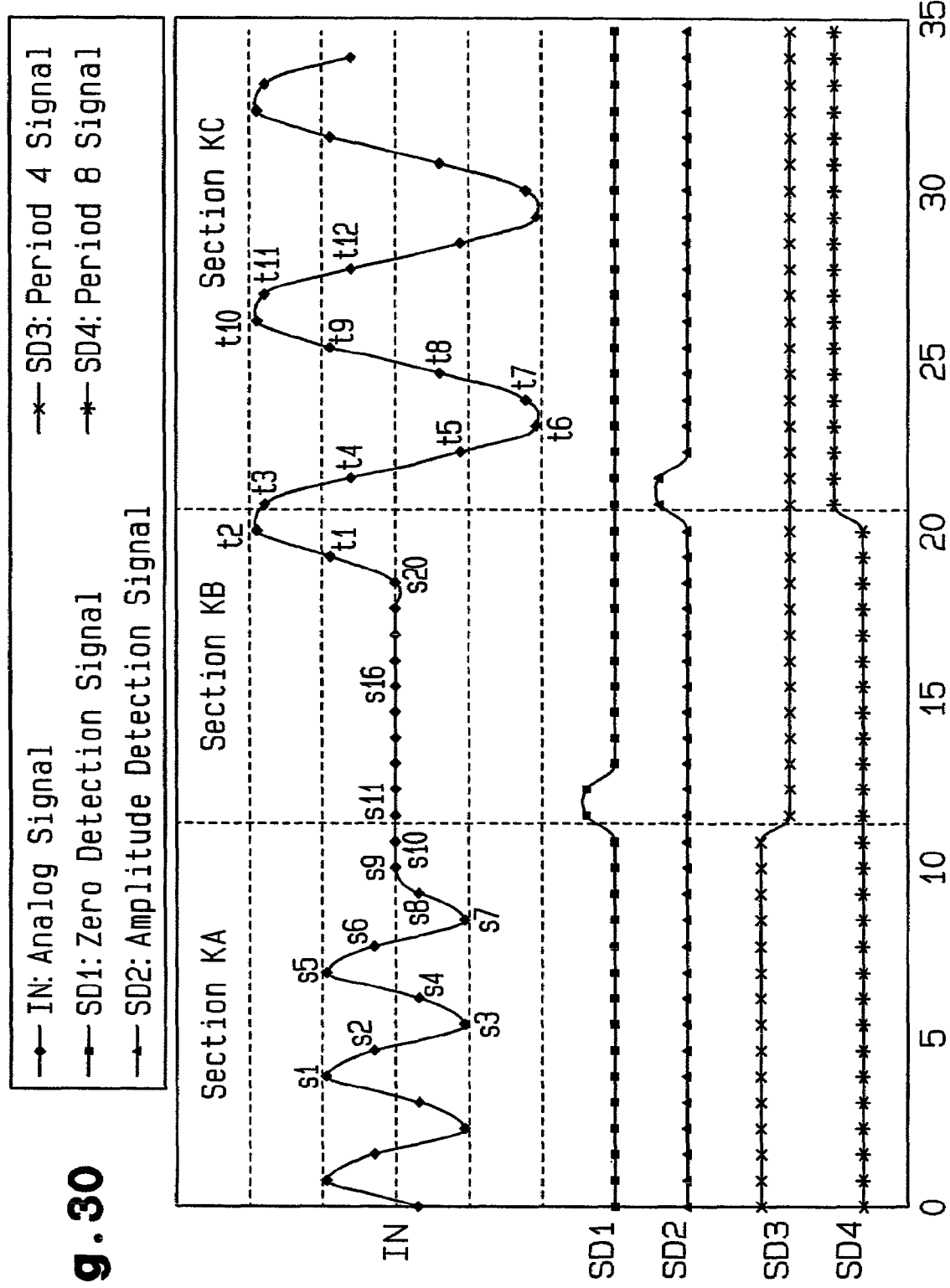
FIG. 30 is a waveform chart showing an example of phase servo for a hard disk drive.

FIG. 30 is a waveform chart of the phase servo for a hard disk drive. The analog input signal IN is divided into three sections: a section KA, a section KB, a section KC in accordance with the purpose of the phase servo. In the analog input signal IN divided into the sections KA to KC, the final purpose of the phase servo is to calculate the phase of the section KC. The section KB is provided for setting a reference point of a phase calculating period (hereinafter referred to as simply called the reference point) for calculating the phase of the section KC. The section KA is provided for detecting the reference point.

The reference point is set at a point at which a zero level (sampling level) of the analog input signal IN continues n times. In the eighth embodiment, the reference point is a point at which the zero level continues three times.

In FIG. 30, a zero detection signal SD1 changes to H level when the zero level of the analog input signal IN continues three times. An amplitude detection signal SD2 detects fluctuations of the analog input signal IN from the zero level. An amplitude detection signal SD2 changes to H level when a non-zero level of the analog input signal IN continues three times.

A period 4 signal SD3 changes from H level to L level in response to the zero detection signal SD1 at H level. When the period 4 signal SD3 is at H level, one period of the analog input signal IN corresponds to a duration of four clock pulses of the clock signal CLK.

A period 8 signal SD4 changes from L level to H level in response to the amplitude signal SD2 at H level. When the period 8 signal is at H level, one period of the analog input signal IN corresponds to a duration of eight clock pulses of the clock signal CLK. The period 4 signal SD3 and the period 8 signal SD4 are supplied to the delay circuit 94, the average processing circuit 95, and the gain selector circuit 96.

Figure 31:
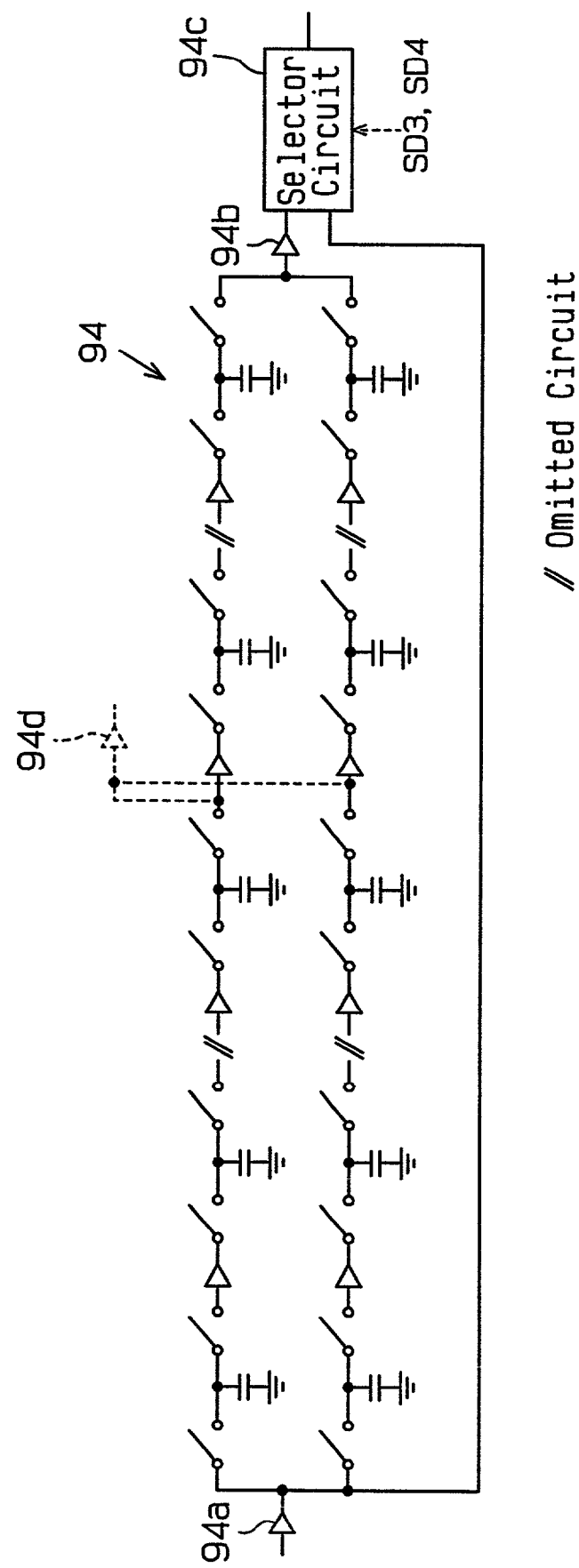
FIG. 31 is a schematic circuit diagram of a delay circuit in the AGC of FIG. 29.

FIG. 31 is a schematic circuit diagram of the delay circuit 94. The delay circuit 94 includes eight delay stages connected in series (in FIG. 31, a portion of the circuit is omitted), an input buffer 94*a*, an output buffer 94*b*, and a selector circuit 94*c*.

The selector circuit 94*c* is connected to the output buffer 94*b*, and receives the period 4 signal SD3 and the period 8 signal SD4. The selector circuit 94*c* selects the number of delay stages in the delay circuit 94 in accordance with detected levels of the respective signals SD3, SD4. For example, the selector circuit 94*c* sets the number of delay stages to "8" in response to the period 8 signal SD4 at H level, and sets the number of delay stages to "0" (i.e., without delay) in response to the period 8 signal SD 4 at L level.

Figure 32:
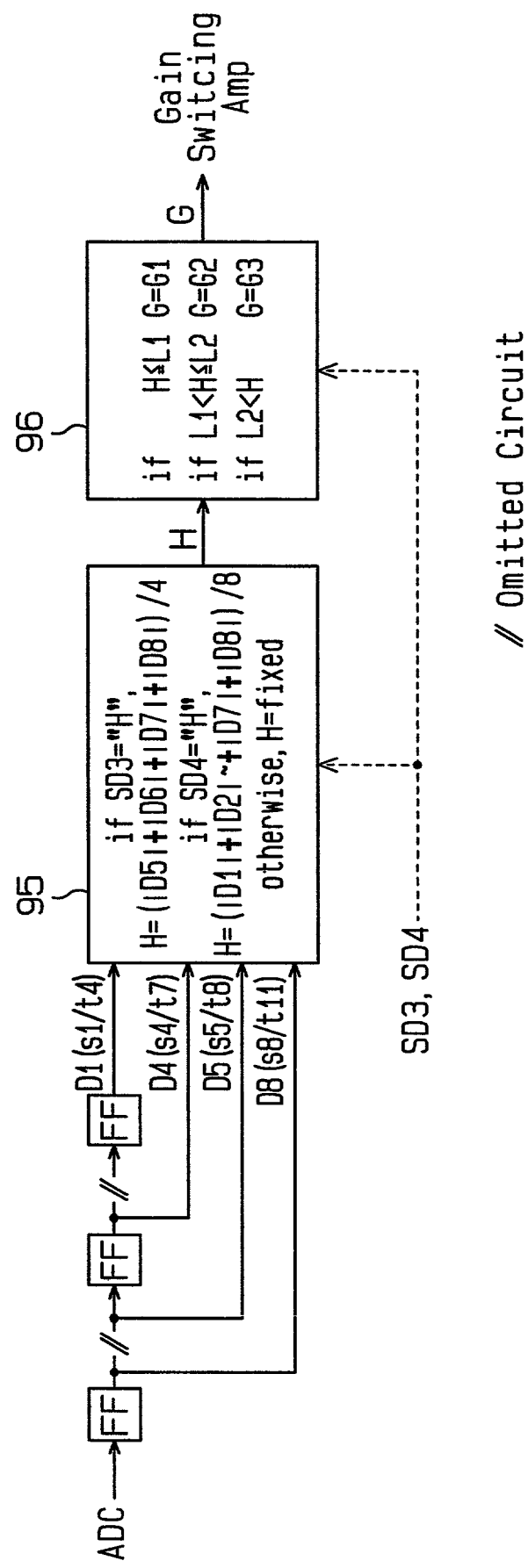
FIG. 32 is a schematic block diagram of an average processing circuit and a gain selector circuit in the AGC of FIG. 29.

FIG. 32 is a schematic block diagram of the average processing circuit 95 and the gain selector circuit 96. The average processing circuit 95 includes eight FFs connected in series on the input side (in FIG. 32, a portion of the circuit is omitted). The respective FFs latch sampling values D1 to D8, respectively, sampled by the ADC 93, and output the latched sampling values D1 to D8. For example, the respective FFs latch sampling values s1-s8 or t4-t11 as illustrated in FIGS. 30 and 32.

The average processing circuit 95 receives the period 4 signal SD3 and period 8 signal SD4, and changes a method of calculating an average value H in response to the levels of the respective signals SD3, SD4. For example, the average processing circuit 95 calculates the average value H of sampling values D5 to D8 in response to the period 4 signal SD3 at H level, and calculates the average value H of the sampling values D1 to D8 in response to the period 8 signal SD4 at H level. The average processing circuit 95 fixes the average value H to a constant value in response to the period 4 signal SD3 and the period 8 signal SD4 at L level.

Next, the action of the AGC 91 will be described.

In the section KA of FIG. 30, the period 4 signal SD3 is at H level. In this event, since the period 8 signal SD4 is at L level, the number of delay stages in the delay circuit 94 is set to "0" (i.e., without delay). The average processing circuit 95 calculates the average value H of the sampling values D5 to D8 in response to the period 4 signal SD3 at H level.

Therefore, in the section KA, the gain switching amplifier 97 amplifies an analog value corresponding to the sampling timing of a sampling value s8 in accordance with a gain G set in accordance with the average value H of the sampling values s5 to s8. In other words, in the section KA, the signal value of the analog signal to be controlled is controlled in accordance with the gain G which is selected in accordance with the average value H of a plurality of sampling values that have been sampled previous to the signal value.

Next, as the zero-level value continues three times to cause the zero detection signal SD1 to change to H level, the level of the period 4 signal changes to L level in response to the signal SD1 at H level (start of the section KB).

In the section KB, the number of delay stages in the delay circuit 94 is set at "0". The average processing circuit 95 sets the average value H to a constant value in response to the signals SD3, SD4 at L level. Specifically, since the zero level continues in the section KB, the average value H calculated by the average processing circuit 95 in the section KB is fixed to an average value at the time the zero detection signal SD1 rises (for example, an average value of sampling signals s8 to s11).

Next, as a non-zero level value continues three times, the level of the amplitude signal SD2 changes to H level. In this event, the level of the period 8 signal SD4 changes to H level in response to the signal SD2 at H level (start of the section KC).

In the section KC, the number of delay stages in the delay circuit 94 is set to "8" in response to the period 8 signal SD4 at H level. The average processing circuit 95 calculates the average value H of the sampling values D1 to D8 in response to the period 8 signal SD4 at H level.

Thus, in the section KC, the gain switching amplifier 97 amplifies an analog value corresponding to the sampling timing of the sampling value t4 in accordance with the gain G which is set in accordance with the average value H of the sampling values t4 to t11. In other words, in the section KC, a signal value of an analog signal to be controlled is controlled in accordance with a gain G selected in accordance with an average value H of a plurality of sampling values which are sampled subsequent to the signal value.

The AGC 91 of the eighth embodiment has the following advantage.

When the waveform of the analog input signal IN has been roughly known beforehand, the AGC 91 changes the number of delay stages in the delay circuit 94, and the number of sampling values (number of samples) as appropriate for use in the calculation of the average value H in accordance with the analog input signal IN. It is therefore possible to control an analog value to be actually controlled in accordance with the gain G which is set in accordance with a plurality of sampling values that are sampled previous or subsequent to the analog value.

It should be apparent to those skilled in the art that the present invention may be embodied in many other specific forms without departing from the spirit or scope of the invention. Particularly, it should be understood that the invention may be embodied in the following forms.

In the third to eighth embodiments, the analog signal may be delayed not in synchronism with the clock signal CLK.

Figure 34:
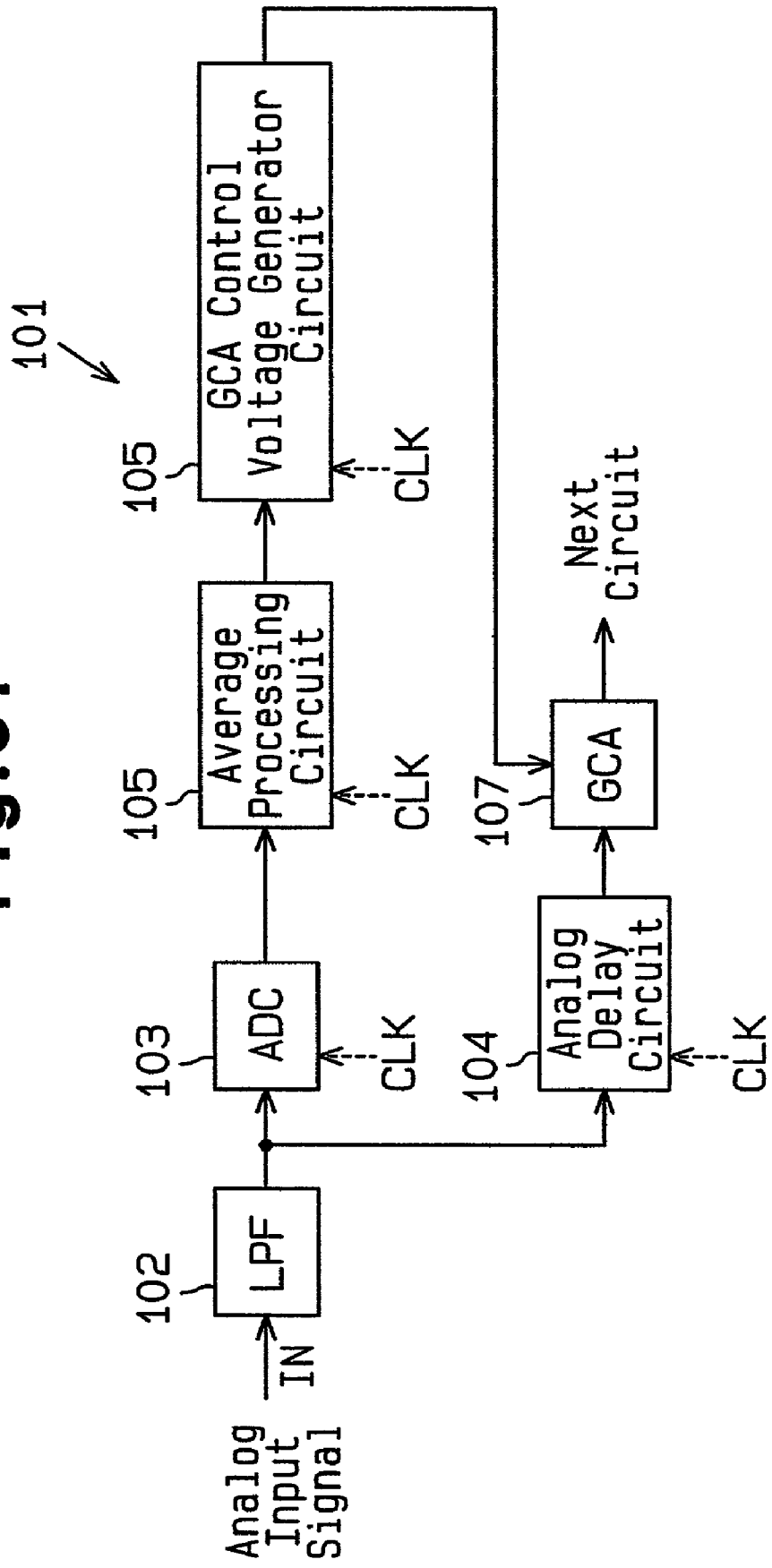
FIG. 34 is a schematic block diagram of another AGC.
Figure 35:
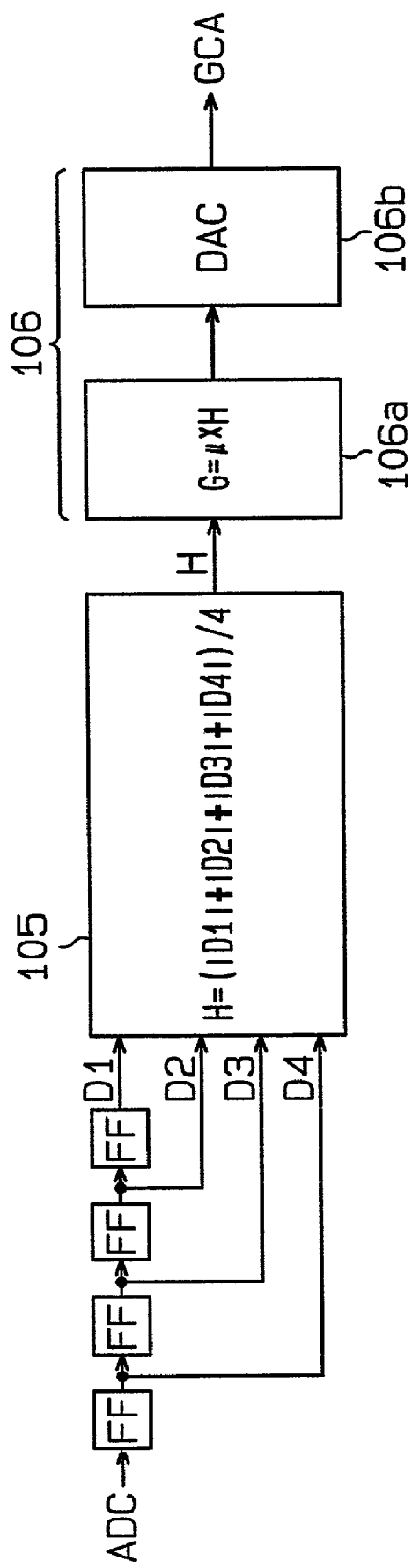
FIG. 35 is a schematic block diagram of an average processing circuit and a GCA control voltage generator circuit in the AGC of FIG. 34.

In the fifth to eighth embodiments, the gain selector circuits 67, 85 may be changed to a GCA control circuit 106 in FIG. 34. In the AGC 101 in FIG. 34, a GCA control voltage generator circuit (hereinafter referred to as GCA control circuit) 106 is connected to an average processing circuit 105. The gain is set for a GCA 107 in accordance with a GCA control signal of the GCA control circuit 106. FIG. 35 is a schematic block diagram of the average processing circuit 105 and the GCA control circuit 106 in FIG. 34. The average processing circuit 105 is substantially equal in configuration to the average processing circuit 66 (see FIG. 24). The GCA control circuit 106 includes a gain calculating circuit 106*a* for calculating a gain in accordance with an output signal (i.e., the average value H) of the average processing circuit 105, and a DAC 106*b* for converting a calculated gain signal of the calculating circuit 106*a* to an analog signal to generate a GCA control signal. The AGC 101 has similar advantages to the AGCs of the fifth to eighth embodiments.

Figure 33:
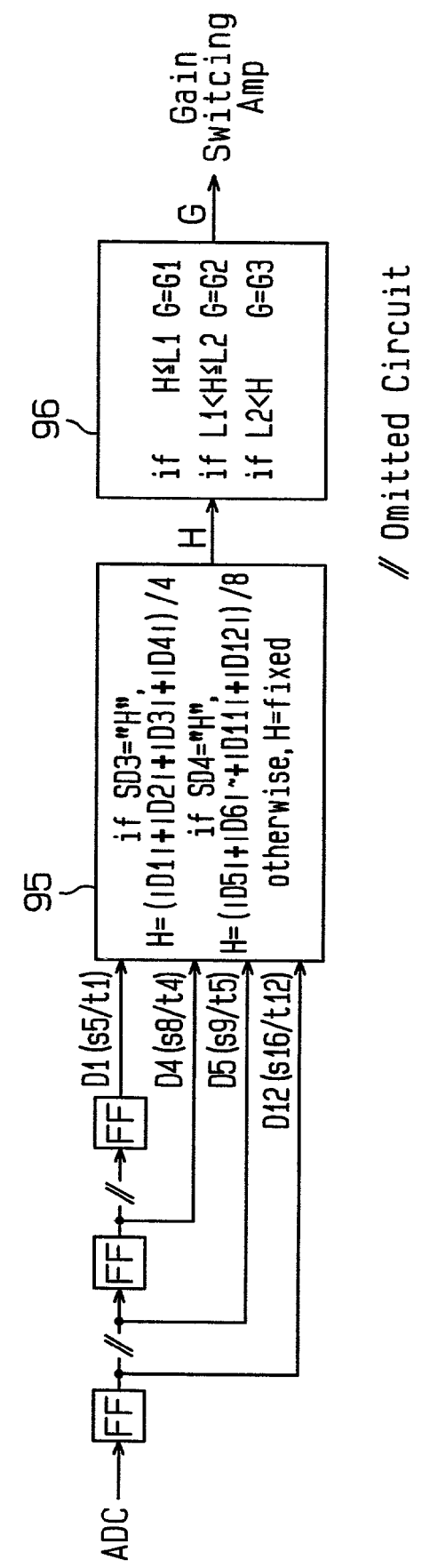
FIG. 33 is a schematic block diagram of another average processing circuit and gain selector circuit in the AGC of FIG. 29.

In the eighth embodiment, the average processing circuit 95 in FIG. 32 may be changed to an average processing circuit 95*a* in FIG. 33. The average processing circuit 95*a* includes 12 FFs (in FIG. 33, a portion of the circuit is omitted) on the input side. The respective FFs latch sampling values D1 to D12, respectively. In the sampling values D1 to D12 latched by the respective FFs, for example, an analog value to be actually controlled is assumed to be the sampling value D4; data previous to the sampling value D4 to be the sampling values D1 to D3; and data subsequent to the sampling value D4 to be the sampling values D5 to D12. The average processing circuit 95*a* calculates an average value H of the sampling values D1 to D4 when the period 4 signal SD3 is at H level, and calculates an average value H of the sampling values D5 to D12 when the period 8 signal SD4 is at H level.

Specifically, in the eighth embodiment, the positions of a plurality of sampling values employed for calculating the average value H in the average processing circuit 95*a* may be changed as appropriate in accordance with the characteristic of the waveform of a particular analog signal.

In the eighth embodiment, as indicated by dotted lines in FIG. 31, a buffer 94*d* may be added to the delay circuit 94 to generate a plurality of delay analog signals, from the delay circuit 94, which differ in delay time from one another.

In the eighth embodiment, the number of delay stages in the delay circuit 94 may be set to eight at all times.

Therefore, the present examples and embodiments are to be considered as illustrative and not restrictive and the present invention is not to be limited to the details given herein, but may be modified within the scope and equivalence of the appended claims.

What is claimed is:

1. An analog signal control method comprising the steps of:
    converting the analog signal to a digital signal via an analog signal process path;
    performing an arithmetic processing of the digital signal via the analog signal process path, to generate a control signal for controlling the analog signal;
    delaying the analog signal corresponding to a latency caused by the generation of the control signal to generate a delayed analog signal in an analog signal transmission path that is different from the analog signal transmission path; and
    controlling the delayed analog signal in accordance with the control signal in the analog signal transmission path.

2. The analog signal control method according to claim 1, wherein:
    the step of converting the analog signal includes sampling the analog signal at a predetermined sampling timing to generate a sampling value;
    the step of generating a control signal includes generating the control signal in accordance with the sampling value; and
    the step of delaying includes delaying the analog signal to control the analog signal in accordance with the control signal, the analog signal having the sampling value corresponding to the predetermined sampling timing.

3. The analog signal control method according to claim 1, wherein:
    the step of converting the analog signal includes sampling the analog signal at a predetermined sampling timing to generate a sampling value;
    the step of generating a control signal includes generating the control signal in accordance with the sampling value; and
    the step of delaying includes delaying the analog signal by a latency equal to or larger than a possible latency to control the analog signal in accordance with the control signal, the analog signal having a sampling value produced by sampling the analog signal at a timing previous to the predetermined sampling timing.

4. The analog signal control method according to claim 1, wherein:
    the step of converting the analog signal includes sampling the analog signal at a plurality of predetermined timings to generate a plurality of sampling values;
    the step of generating a control signal includes calculating the plurality of sampling values to generate the control signal; and
    the step of delaying delays the analog signal to control the analog signal in accordance with the control signal, the analog signal having a sampling value corresponding to an arbitrary sampling timing.

5. The analog signal control method according to claim 1, wherein:
    the step of converting the analog signal includes sampling the analog signal at a plurality of predetermined timings to generate a plurality of sampling values;
    the step of generating a control signal includes calculating the plurality of sampling values to generate the control signal; and
    the step of delaying includes delaying the analog signal to control the analog signal in accordance with the control signal, the analog signal having the plurality of sampling values produced by sampling the analog signal at a timing previous to each sampling timing.

6. An analog signal control method comprising the steps of:
    converting the analog signal to a digital signal and an analog signal process path;
    performing an arithmetic processing of the digital signal via the analog signal process path, to generate a control signal for controlling the analog signal;
    delaying the analog signal corresponding to a latency caused by the generation of the control signal in synchronism with a clock signal to generate a delayed analog signal via an analog signal transmission path that is different from the analog signal process path; and
    controlling the delayed analog signal in accordance with the control signal, via the analog signal transmission path.

7. An analog signal controller comprising:
    an ADC for analog-to-digital conversion, the ADC configured to be located in an analog signal process path and converting an analog signal to generate a digital signal;
    a digital arithmetic circuit located in the analog signal process path and connected to the ADC for performing an arithmetic processing of the digital signal to generate a control signal for controlling the analog signal;
    a delay circuit, located in an analog signal transmission path that is different from the analog signal process path, for receiving the analog signal, and delaying the analog signal corresponding to a latency caused by the ADC and the digital arithmetic circuit to generate a delayed analog signal; and
    an analog control circuit, located in the analog signal transmission path and connected to the digital arithmetic circuit and the delay circuit, for controlling the delayed analog input signal in accordance with the control signal.

8. The analog signal controller according to claim 7, wherein:
    the analog signal controller operates in accordance with a clock signal; and the delay circuit includes a pair of switches which operate complementary to each other in synchronism with the clock signal, and delays the analog signal by switching the pair of switches.

9. The analog signal controller according to claim 8, wherein:
the delay circuit includes a capacitor connected to a node between the pair of switches and a ground.

10. The analog signal controller according to claim 8, wherein:
the delay circuit includes a plurality of delay stages connected in series, each of the delay stages including the pair of switches;
the ADC samples the analog signal to generate a sampling value; and
the delay circuit further includes a selector circuit for selecting a number of connected ones of the plurality of delay stages in accordance with the sampling value of the analog signal.

11. The analog signal controller according to claim 10, wherein:
each of the plurality of delay stages includes a capacitor connected to a node between the pair of switches and a ground.

12. The analog signal controller according to claim 7, wherein:
the delay circuit includes a capacitor for delaying the analog signal; and
the capacitor has a capacitance value which is set such that the analog signal is delayed corresponding to the latency.

13. The analog signal controller according to claim 7, wherein:
the delay circuit includes a variable capacitor for delaying the analog signal; and
the variable capacitor is set such that the analog signal is delayed corresponding to the latency.

14. An automatic gain controller comprising:
a first control loop, located in an analog signal process path, for receiving an analog signal to generate a control signal for setting a predetermined gain for use in amplifying the analog signal;
a delay circuit, located in an analog signal transmission path that is different from the analog signal process path, for receiving the analog signal, and delaying the analog signal corresponding to a latency caused by the first control loop to generate a delayed analog signal; and gain control amplifier (GCA), located in the analog signal transmission path and connected to the delay circuit and the first control loop, for amplifying the delayed analog signal in accordance with a predetermined gain set by the control signal to generate an amplified analog signal.

15. An automatic gain controller comprising:
a first control loop, the first control loop including:
a first gain control amplifier (GCA) for amplifying the analog signal in accordance with a first predetermined gain to generate a first amplified analog signal;
an analog to digital converter (ADC) connected to the first GCA for analog-to-digital converting the first amplified analog signal to generate a digital signal;
an error calculating circuit connected to the ADC for calculating an error between a target value which is set such that the first amplified analog signal substantially covers a full range for an input level of the ADC, and the digital signal to generate an error digital signal in accordance with the error;

a digital to analog converter (DAC) connected to the error calculating circuit for digital-to-analog converting the error digital signal to generate a control signal for setting a second predetermined gain;
a delay circuit for delaying the analog signal corresponding to a latency occurring in the first control loop to generate a delayed analog signal; and
a second GCA connected to the delay circuit and the first control loop for amplifying the delayed analog signal in accordance with the second predetermined gain set by the control signal to generate a second amplified analog signal.

16. The automatic gain controller according to claim 15, further comprising:
a control loop connected to the second GCA for calculating an error for the second amplified analog signal.

17. The automatic gain controller according to claim 15, wherein:
the AGC operates in accordance with a clock signal; and
the delay circuit includes a delay stage for delaying the analog signal in synchronism with the clock signal.

18. The automatic gain controller according to claim 17, wherein:
the delay stage is one of a plurality of delay stages connected in series; and
the delay circuit further includes a selector circuit for selecting the number of connected ones of the plurality of delay stages in accordance with a predictable waveform of the analog signal.

19. An automatic gain controller comprising:
a first analog to digital converter (ADC) for sampling an analog signal to generate a first plurality of sampling values, the first ADC generating a first digital signal in accordance with the first plurality of sampling values;
a first average processing circuit connected to the first ADC for calculating an average value of the first plurality of sampling values in accordance with the first digital signal to generate a first average value signal indicative of the calculated average value;
a first gain selector circuit connected to the first average processing circuit for selecting a first gain for controlling the analog signal in accordance with the average value of the first average value signal, and generating a first control signal in accordance with the selected first gain;
a first delay circuit for receiving the analog signal, and delaying the analog signal corresponding to a first latency occurring in the first ADC, the first average processing circuit, and the first gain selector circuit to generate a first delayed analog signal; and
a gain switching amplifier connected to the first delay circuit and the first gain selector circuit for amplifying the first delayed analog signal in accordance with the first gain selected by the first control signal to generate a first amplified analog signal.

20. The automatic gain controller according to claim 19, further comprising:
a second AGC connected to the first gain switching amplifier for amplifying the first amplified analog signal, wherein the second AGC includes:
a second ADC for sampling the first amplified analog signal to generate a second plurality of sampling values, the second ADC generating a second digital signal in accordance with the second plurality of sampling values;
a second average processing circuit connected to the second ADC for calculating an average value of the second plurality of sampling values in accordance with the second digital signal to generate a second average value signal indicative of the calculated average value;

a second gain selector circuit connected to the second average processing circuit for selecting a second gain for controlling the first amplified analog signal in accordance with an average value of the second average value signal, and generating a second control signal in accordance with the selected second gain;

a second delay circuit for receiving the first amplified analog signal, and delaying the first amplified analog signal corresponding to a second latency occurring in the second ADC, the second average processing circuit, and the second gain selector circuit to generate a second delayed analog signal; and a second gain switching amplifier connected to the second delay circuit and the second gain selector circuit for amplifying the second delay analog signal in accordance with the second gain selected by the second control signal to generate a second amplified analog signal.

21. The automatic gain controller according to claim 19, further comprising:

a control loop connected to the first gain switching amplifier for calculating an error of the first amplified analog signal.

22. The automatic gain controller according to claim 19, wherein:

the first average processing circuit changes sampling numbers of the first plurality of sampling values in accordance with a predicted waveform of the analog signal when the waveform of the analog signal is predictable.

23. The automatic gain controller according to claim 19, wherein:

the first average processing circuit changes sampling positions of the first plurality of sampling values in accordance with a predicted waveform of the analog signal when the waveform of the analog signal is predictable.

* * * * *

UNITED STATES PATENT AND TRADEMARK OFFICE
CERTIFICATE OF CORRECTION

PATENT NO.       : 7,298,800 B2                                   Page 1 of 1
APPLICATION NO.  : 10/091432
DATED            : November 20, 2007
INVENTOR(S)      : Shigetaka Asano It is certified that error appears in the above-identified patent and that said Letters Patent is hereby corrected as shown below:

Column 20, Line 31, change "and" to --via--.

Column 21, Line 48, after "and" insert --a--.

Signed and Sealed this

Twenty-sixth Day of August, 2008

JON W. DUDAS
*Director of the United States Patent and Trademark Office*